United States Patent [19]
Watanabe et al.

[11] Patent Number: 6,005,289
[45] Date of Patent: Dec. 21, 1999

[54] PACKAGE FOR SEMICONDUCTOR DEVICE LAMINATED PRINTED CIRCUIT BOARDS

[75] Inventors: Masaki Watanabe; Akiyoshi Sawai; Yoshikazu Narutaki; Tomoaki Hashimoto; Masatoshi Yasunaga; Jun Shibata; Hiroshi Seki; Kazuhiko Kurafuchi, all of Tokyo; Katsunori Asai, Hyogo, all of Japan

[73] Assignees: Mitsubishi Denki Kabushiki Kaisha, Tokyo; Ryoden Semiconductor System Engineering Corporation, Hyogo, both of Japan

[21] Appl. No.: 08/738,935

[22] Filed: Oct. 24, 1996

[30] Foreign Application Priority Data

Mar. 28, 1996 [JP] Japan ................................ 8-074571

[51] Int. Cl.⁶ ........................ H01L 23/053; H01L 23/48
[52] U.S. Cl. ..................... 257/700; 257/774; 361/751; 361/803
[58] Field of Search ....................... 257/700, 774; 361/784, 803, 751, 666

[56] References Cited

U.S. PATENT DOCUMENTS

| | | | |
|---|---|---|---|
| 5,315,072 | 5/1994 | Arai et al. | 74/262 |
| 5,490,324 | 2/1996 | Newman | 29/830 |
| 5,814,883 | 9/1998 | Sawai et al. | 257/712 |

FOREIGN PATENT DOCUMENTS

| | | |
|---|---|---|
| 7099391 | 4/1995 | Japan . |
| 7202069 | 8/1995 | Japan . |
| 7263869 | 10/1995 | Japan . |
| 7273241 | 10/1995 | Japan . |

*Primary Examiner*—Teresa M. Arroyo
*Attorney, Agent, or Firm*—Leydig, Voit & Mayer, Ltd.

[57] ABSTRACT

The minimum spacing between wires disposed on a printed circuit board of a printed circuit board ball grid array package is reduced. Wiring layers are narrower than in the prior art because they are not plated and because only one metal layer is plated on the wiring layers. The narrower wiring layers can be formed easily with small spaces between wires.

5 Claims, 41 Drawing Sheets

F I G. 1 5
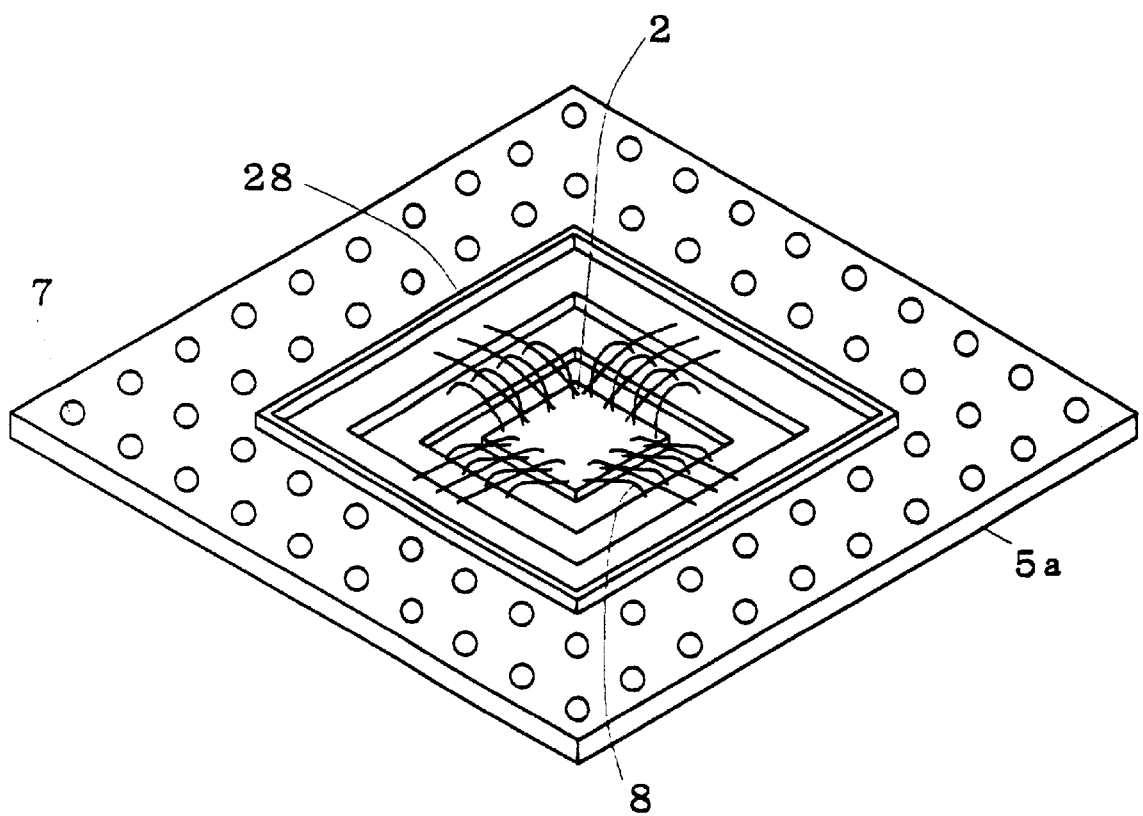

F I G. 3 6
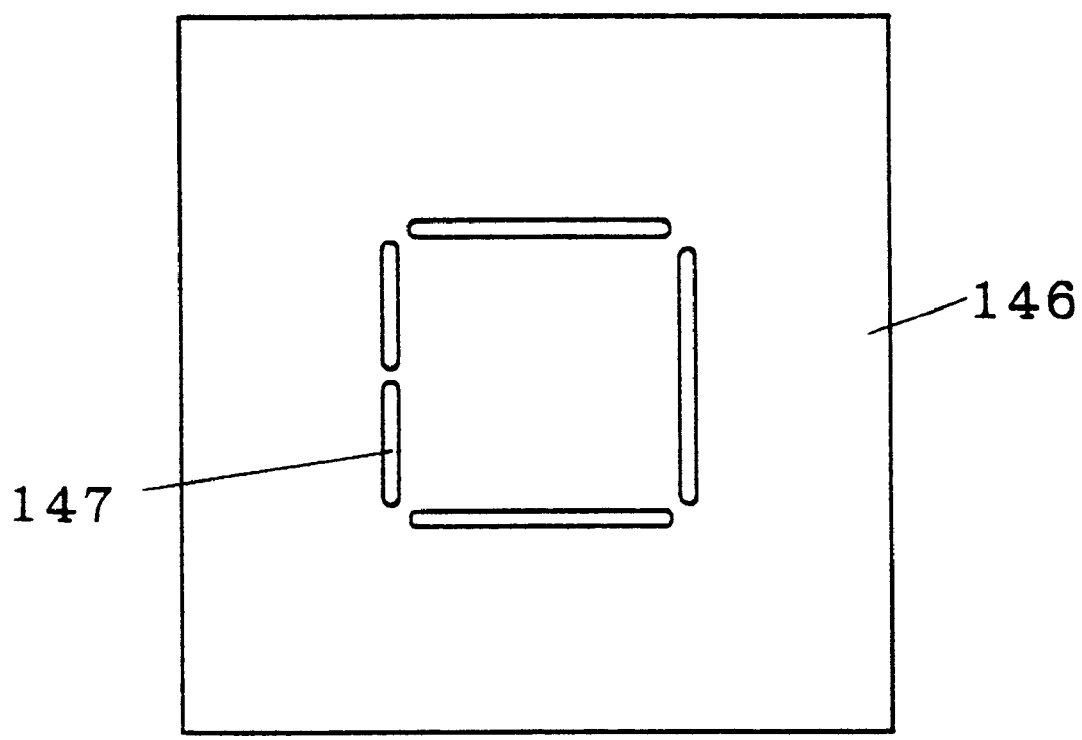

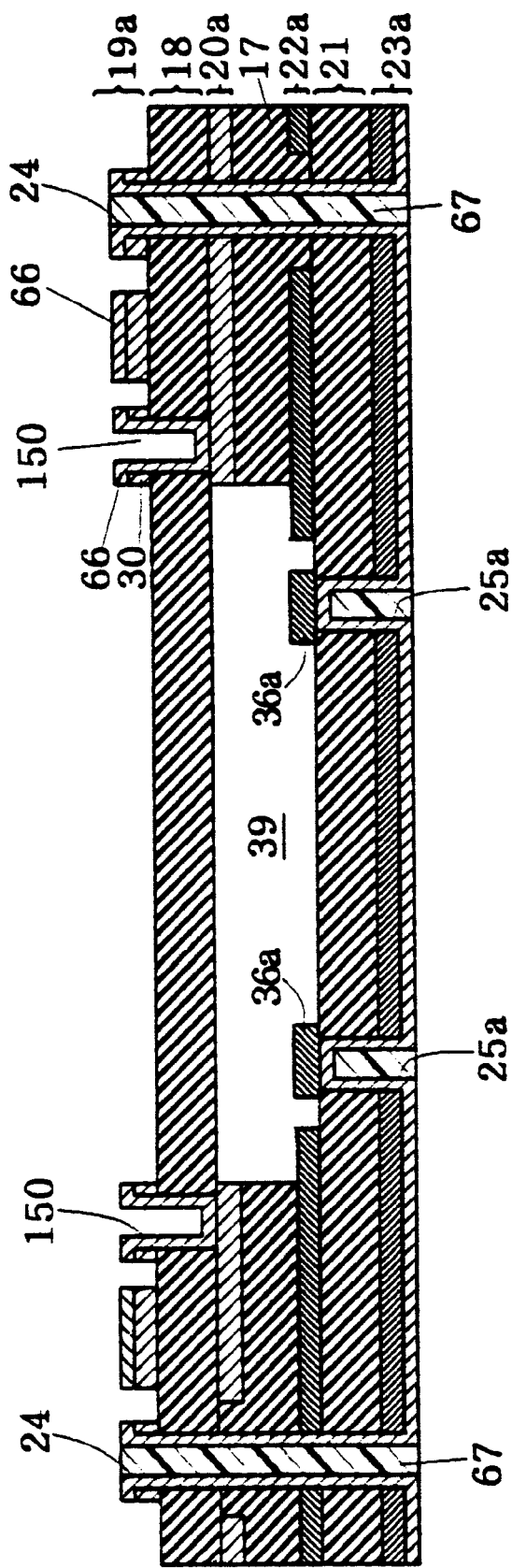

PACKAGE FOR SEMICONDUCTOR DEVICE LAMINATED PRINTED CIRCUIT BOARDS

BACKGROUND OF THE INVENTION

1. Field of the Invention

The present invention relates to a method for manufacturing a semiconductor device comprising a printed circuit board ball grid array (BGA) and a package for the semiconductor device and, more particularly, to a method for manufacturing a semiconductor device comprising a printed circuit board BGA package in which a plurality of printed wiring boards are laminated, and a package for the semiconductor device.

2. Description of the Background Art

FIG. 57 is a sectional view showing the structure of a semiconductor device according to the prior art. In FIG. 57, reference numeral 1 designates a semiconductor device comprising a printed circuit board BGA package, reference numeral 2 designates a chip in the semiconductor device 1, reference numeral 3 designates a slug on which the chip 2 is placed, reference numeral 4 designates a die bonding resin bonding the chip 2 to the slug 3, reference numeral 5 designates a frame around the chip 2 and having a first main surface to which the slug 3 is bonded, reference numeral 6 designates an adhesive bonding the frame 5 to the slug 3, reference numeral 7 designates a solder ball on a second main surface of the frame 5, reference numeral 8 designates a wire electrically connecting the chip 2 to the frame 5, reference numeral 9 designates a cavity in the central portion of the frame 5 housing the chip 2, reference numeral 10 designates a sealing resin filling the cavity 9 and sealing the chip 2, and reference numeral 11 designates a dam on the second main surface of the frame 5, closing an opening and preventing the sealing resin 10 from flowing out.

The frame 5 comprises two laminated double-sided printed circuit boards 15 and 16 and a prepreg 17 bonding them. The double-sided printed circuit board 15 has wiring layers 19 and 20 on both sides of an insulating substrate 18. The double-sided printed circuit board 16 has wiring layers 22 and 23 on both sides of an insulating substrate 21.

The wiring layers 19 and 20 and the wiring layers 22 and 23 on both sides of the double-sided printed circuit boards 15 and 16 are connected by interstitial via holes. The double-sided printed circuit boards 15 and 16 are connected by a through hole 24. The signals and power are exchanged between the chip 2 and a board on which the semiconductor device 1 is placed through the wire 8, the wiring layers 19, 20, 22, and 23, the through hole 24, the interstitial via hole 25, the solder ball 7, and the like.

A method for manufacturing the printed circuit board BGA package shown in FIG. 57 is described with reference to FIGS. 43 to 57.

First, a double-sided printed circuit board 15 having copper foils 30 and 31 laminated on both sides is prepared (see FIG. 43).

Then a hole 32 for an interstitial via hole, penetrating the double-sided printed circuit board 15, is formed (see FIG. 44). The double-sided printed circuit board 15 is plated with a copper plated layer 33. Thus, an interstitial via hole 25 is formed (see FIG. 45). As shown in FIG. 46, the interstitial via hole 25 is filled with a resin 34. Consequently, no gap which penetrates the double-sided printed circuit board 15 is present. A wiring layer 20 of the double-sided printed circuit board 15 is then patterned (see FIG. 47).

After performing the same steps as shown in FIGS. 43 to 47, a double-sided printed circuit board 16 is prepared. The circuit board 15 includes the interstitial via hole 25 filled with the resin 34 and a patterned wiring layer 22 (see FIG. 48). The double-sided printed circuit board 16 comprises copper foils 35 and 36 and a copper plated layer 37 thereon.

The double-sided printed circuit board 15 shown in FIG. 47 and the double-sided printed circuit board 16 shown in FIG. 48 are bonded together by a prepreg 17. Consequently, the laminated printed circuit board 38 is an aggregate of the double-sided printed circuit boards 15 and 16 (see FIG. 49). A chamber 39 for forming a cavity 9 shown in FIG. 57 is located between the double-sided printed circuit boards 15 and 16 in the central portion of the laminated printed circuit board 38. A hole 40 penetrating the laminated printed circuit board 38 is located in a region 41 of the laminated printed circuit board 38 where the prepreg 17 is inserted (see FIG. 50). The laminated printed circuit board 38 is plated with a copper plated layer 42. Thus, a through hole 24 is formed (see FIG. 51). The laminated printed circuit board 38 is immersed in a plating solution to be plated with copper. However, the interstitial via hole 25 has been filled with a resin so that the chamber 39 has been sealed so the plating solution does not invade the chamber 39.

Subsequently, the through hole 24 is filled with a resin 43 as shown in FIG. 52. Then a wiring layer 19 is patterned (see FIG. 53). At the same time, the copper foil 30 and the copper plated layers 33 and 42 of the wiring layer 19, located in an upper region 44 of the chamber 39, are removed. An insulating substrate 18 in the upper region 44 is machined with a router to form an opening 45. After that, a nickel-gold layer 46 is plated on the copper plated layers 37 and 42 (see FIG. 54).

As shown in FIG. 55, a wiring layer 23 is patterned. At the same time, the copper foil 35 and the copper plated layers 37 and 42 in a lower region 47 of the chamber 39 are removed. As shown in FIG. 56, an opening 48 is formed in the lower region 47 so that a frame 5 is completed. A slug 3 is bonded to the frame 5 with an adhesive 6.

The chip 2 is bonded to the slug 3 with a die bonding resin 4 and the chip 2 is connected to the nickel-gold plated layer 46 by a wire 8. After a dam 11 is put in place, the cavity 9 is filled with a sealing resin 10. Then, a solder ball 7 is formed on the nickel-gold plated layer 46 of the wiring layer 19. The printed circuit board BGA package is thus completed (see FIG. 57).

In the semiconductor device and the method for manufacturing the semiconductor device according to the prior art, the copper plated layers 33 and 37 are formed on the copper foils 31 and 36 of the wiring layers 20 and 22, and the copper plated layer 33 or 37 and the copper plated layer 42 are formed doubly on the copper foils 30 and 37 of the wiring layers 19 and 23. Consequently, the thicknesses of the wiring layers 19, 20, 22, and 23 are increased. For this reason, it is hard to reduce the pitches of patterns on the wiring layers 19, 20, 22, and 23.

This problem will be described with reference to FIGS. 58 and 59. FIG. 58 is a sectional view showing a wiring layer 50A including a copper foil 52 and a copper plated layer 51 with a pattern having a minimum pitch. The formed pattern has a predetermined inclination 53 which depends on the conditions of patterning. In FIG. 58, reference numeral 55 designates a minimum required space between patterns, and reference numeral 54 designates pattern pitch. FIG. 59 is a sectional view showing a wiring layer 50B including only the copper foil 52 and a pattern at the minimum pitch. Similar to the section of the pattern shown in FIG. 58, the pattern shown in FIG. 59 has a predetermined inclination 53 which depends on the conditions of patterning. In FIG. 59, reference numeral 55 designates a minimum required space between patterns, and reference numeral 56 designates pattern pitch. As seen from a comparison of FIGS. 58 and 59, the pitch 54 is greater than the pitch 56. When the thickness of the wiring layer increases, it becomes harder to reduce the pitch of the wiring pattern.

Furthermore, the through hole 24 and the interstitial via hole 25 should be plated in separate plating steps. Consequently, the number of manufacturing steps is increased. In addition, it is necessary to immerse the laminated printed circuit board 38 in a plating solution when forming the through hole 24. For this reason, filling the interstitial via hole 25 with the resin cannot be omitted.

SUMMARY OF THE INVENTION

A first aspect of the present invention is directed to a method for manufacturing a semiconductor device comprising preparing a first printed circuit board having an insulating substrate, a first metallic foil on a first main surface of the insulating substrate, a second metallic foil on a second main surface of the insulating substrate, and a first hole therein, the first hole penetrating the first metallic foil, reaching the second metallic foil and being covered by the second metallic foil; patterning the second metallic foil and leaving a region covering the first hole; bonding a member to the second main surface of the insulating substrate to form a sealed chamber facing the region covering the first hole; plating the first hole to form a first conductive path connecting the first and second metallic foils; and forming openings which reach the chamber to produce a structure including the first printed circuit board and the member after forming the first conductive path.

A second aspect of the present invention is directed to the method for manufacturing a semiconductor device according to the first aspect of the present invention wherein preparing the first printed circuit board comprises forming the first metallic foil on the first main surface of the insulating substrate, forming the first hole penetrating the insulating substrate and the first metallic foil, and laminating the second metallic foil on the second main surface of the insulating substrate.

A third aspect of the present invention is directed to the method for manufacturing a semiconductor device according to the first aspect of the present invention wherein preparing the first printed circuit board comprises preparing the insulating substrate having the first and second metallic foils on the first and second main surfaces, patterning the first metallic foil in a region where the first hole is to be formed, and irradiating with laser beams from the patterned first metallic foil side.

A fourth aspect of the present invention is directed to the method for manufacturing a semiconductor device according to the first, second, or third aspects of the present invention wherein the member includes a laminated product having a first main surface bonded to the second main surface of the insulating substrate, a second main surface and a third metallic foil on the second main surface, further comprising forming a second hole penetrating a portion from the third metallic foil to the first metallic foil before forming the first conductive path, and wherein a second conductive path for connecting the third metallic foil to the first metallic foil is simultaneously formed when forming the first conductive path.

A fifth aspect of the present invention is directed to the method for manufacturing a semiconductor device according to the fourth aspect of the present invention wherein the laminated product includes a second printed circuit board having a first main surface on which the third metallic foil is present, a second main surface, and a fourth metallic foil on the second main surface, further comprising forming a third hole penetrating the third metallic foil, reaching the fourth metallic foil, and covered with the fourth metallic foil for the first printed circuit board, before forming the first conductive path.

A sixth aspect of the present invention is directed to the method for manufacturing a semiconductor device according to the fourth aspect of the present invention wherein the laminated product is formed by preparing an insulating base having the third metallic foil on a first main surface of the insulating base and a concave portion on a second main surface of the insulating base, and a second printed circuit board having a fourth metallic foil on a first main surface of the second printed circuit board, a fifth metallic foil on a second main surface of the second printed circuit board, and a third hole in the second printed circuit board, the third hole penetrating the fourth metallic foil and reaching the fifth metallic foil and covered by the fifth metallic foil, patterning the fifth metallic foil with the region covering the third hole remaining, bonding the second main surface of the insulating base to the second main surface of the second printed circuit board, and plating the third hole to form a third conductive path connecting the fourth and fifth metallic foils.

A seventh aspect of the present invention is directed to the method for manufacturing a semiconductor device according to any of the first to sixth aspects of the present invention wherein the first hole is slit-shaped.

An eighth aspect of the present invention is directed to the method for manufacturing a semiconductor device according to the seventh aspect of the present invention wherein forming the opening comprises scraping the inner wall of the slit-shaped hole, with the outer wall of the slit-shaped hole remaining, to expose the bottom section of the slit-shaped hole, scraping the upper portion of the outer wall of the slit-shaped hole by spot-facing, and forming a pad on the bottom of the slit-shaped hole.

A ninth aspect of the present invention is directed to a package for a semiconductor device having a plurality of double-sided printed circuit boards laminated such that a portion where a cavity for placing a semiconductor chip on the package is hollow, at least one of the double-sided printed circuit boards comprising an insulating substrate having first and second main surfaces, and a through hole penetrating a portion from the first main surface to the second main surface, a first metallic foil on the first main surface of the insulating substrate and having an opening conforming to the through hole, a second metallic foil on the second main surface of the insulating substrate and having a region that covers the through hole, and a metallic wire in the through hole and connecting the first metallic foil to the second metallic foil.

A tenth aspect of the present invention is directed to the package for a semiconductor device according to the ninth aspect of the present invention wherein the through hole is slit-shaped.

An eleventh aspect of the present invention is directed to a package for a semiconductor device having a plurality of laminated double-sided printed circuit boards enclosing a cavity for placing a semiconductor chip, at least one of the double-sided printed circuit boards comprising an insulating substrate having first and second main surfaces, and an opening for forming the cavity, a first wiring layer on the first main surface of the insulating substrate, a second wiring layer on the second main surface of the insulating substrate, a first pad on the first wiring layer, and a second pad on the first main surface side of the second wiring layer.

A twelfth aspect of the present invention is directed to a package for a semiconductor device having a plurality of double-sided printed circuit boards laminated such that a portion where a cavity for placing a semiconductor chip is hollow, at least one of the double-sided printed circuit boards comprising an insulating substrate having first and second main surfaces, and a slit-shaped through hole penetrating a portion from the first main surface to the second main surface, a first wiring layer on the first main surface of the insulating substrate and having an opening conforming to the through hole, a second wiring layer on the second main surface of the insulating substrate and having an opening conforming to the through hole, and a metallic wire in the through hole and connecting the first wiring layer to the second wiring layer.

According to the first aspect of the present invention, the method for manufacturing a semiconductor device comprises patterning the second metallic foil with a region covering the first hole remaining and bonding a member to the second main surface of the insulating substrate to form a sealed chamber facing the region covering the first hole. The second metallic foil is not plated when forming the first conductive path. Only the second metallic foil is patterned. Consequently, a thin conductor layer can be patterned and the pitch between the patterned wirings can be reduced.

According to the second aspect of the present invention, the method for manufacturing a semiconductor device comprises forming the first metallic foil on the first main surface of the insulating substrate, forming the first hole penetrating the insulating substrate and the first metallic foil, and laminating the second metallic foil on the second main surface of the insulating substrate. The steps according to the prior art can be replaced. Consequently, the first printed circuit board can be prepared easily.

According to the third aspect of the present invention, the method for manufacturing a semiconductor device comprises preparing the insulating substrate having the first and second metallic foils on the first and second main surfaces, respectively, patterning the first metallic foil in a region where the first hole is to be formed, and irradiating with laser beams from the patterned first metallic foil side. The insulating substrate having metallic foils on both sides thereof can be used. Consequently, the first printed circuit board can be prepared easily.

According to the fourth aspect of the present invention, the second conductive path for connecting the third metallic foil to the first metallic foil is formed simultaneously when forming the first conductive path. Consequently, the steps in plating to form the conductive path and the like can be reduced as compared with forming the first and second conductive paths separately. Thus, the manufacturing process can be simplified.

According to the fifth aspect of the present invention, the method for manufacturing a semiconductor device comprises forming a third hole penetrating the third metallic foil and reaching the fourth metallic foil and covered with the fourth metallic foil for the first printed circuit board before forming the first conductive path. Consequently, the first conductive path can be formed in the first hole. At the same time, a conductive path can be formed in the third hole. Thus, the manufacturing process can be simplified.

According to the sixth aspect of the present invention, the laminated product formed by bonding the insulating substrate to the second printed circuit board is used. The chamber is formed between the insulating substrate and the second printed circuit board. Consequently, it is possible to produce a semiconductor device in which a portion for supporting a cover is provided on the insulating substrate and bonding can be performed by using a fifth metallic foil that is patterned on the second main surface of the second printed circuit board.

According to the seventh aspect of the present invention, the first hole is slit-shaped. Consequently, the resistance of an interstitial via hole is reduced.

According to the eighth aspect of the present invention, the pad is formed on the outer wall, the bottom of the slit-shaped hole is exposed by scraping the inner wall of the slit-shaped hole, with the outer wall left, and by scraping the upper portion of the outer wall of the slit-shaped hole by spot-facing. Consequently, the pad can be formed at a height corresponding to the first and second main surfaces of the insulating substrate. The semiconductor device can be easily manufactured by varying the height of the pad.

According to the ninth aspect of the present invention, a package for a semiconductor device comprises a second metallic foil on the second main surface of the insulating substrate covering the through hole. Therefore, the first and second main surfaces of the insulating substrate are blocked. For example, the second metallic foil is not exposed to a liquid, such as a plating solution, or gases when plating the first metallic foil. Thus, it is possible to manufacture the package for a semiconductor device easily.

According to the tenth aspect of the present invention, the metallic wiring is provided on the slit-shaped hole as a through hole. Consequently, the resistance of the metallic wiring can be reduced.

According to the eleventh aspect of the present invention, the first and second pads are provided on the first main surface side. However, the heights of the first and second pads are different by the thickness of the insulating substrate. Consequently, the possibility that the bonded wires might be short-circuited is reduced.

According to the twelfth aspect of the present invention, the metallic wiring in the through hole and connecting the first and second wiring layers is slit-shaped. Consequently, the connection resistance of the first and second wiring layers is reduced.

In order to solve the above-mentioned problems, it is an object of the present invention to reduce the number of manufacturing steps by plating a through hole and an interstitial via hole at the same time.

It is another object of the present invention to perform patterning easily at a small pitch without a plated layer on a copper foil, when plating is carried out to form the interstitial via hole.

It is yet another object of the present invention to provide a method for manufacturing a semiconductor device having a printed circuit board BGA package in which filling the interstitial via hole with a resin can be omitted.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a perspective view showing the structure of a semiconductor device according to the first embodiment of the present invention;

FIG. 36 is a plan view showing the structure of the semiconductor device according to the third embodiment of the present invention;

FIG. 37 is a sectional view showing a step in manufacturing a semiconductor device according to a fourth embodiment of the present invention;

DESCRIPTION OF PREFERRED EMBODIMENTS

First Embodiment

A method for manufacturing a semiconductor device according to a first embodiment of the present invention is described below. FIGS. 1 to 14 are sectional views showing steps in manufacturing the semiconductor device. After sequentially performing the steps shown in FIGS. 1 to 14, a semiconductor device according to the first embodiment is completed.

Figure 1:
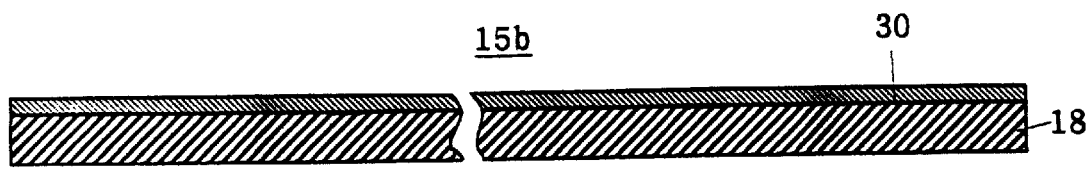
FIG. 1 is a sectional view showing a step in manufacturing a semiconductor device according to a first embodiment of the present invention.
Figure 2:
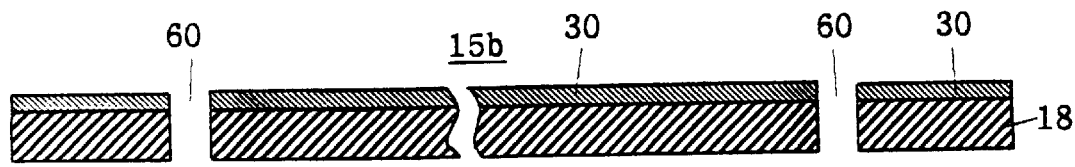
FIG. 2 is a sectional view showing a step in manufacturing the semiconductor device according to the first embodiment of the present invention.

As shown in FIG. 1, a printed circuit board 15b is prepared in which a copper foil 30 is formed on one of main surfaces of an insulating substrate 18. The printed circuit board 15b is a laminated product comprising the copper foil and the insulating substrate. As shown in FIG. 2, a hole 60 for an interstitial via hole is formed. The hole 60 penetrates the printed circuit board 15b.

Figure 3:
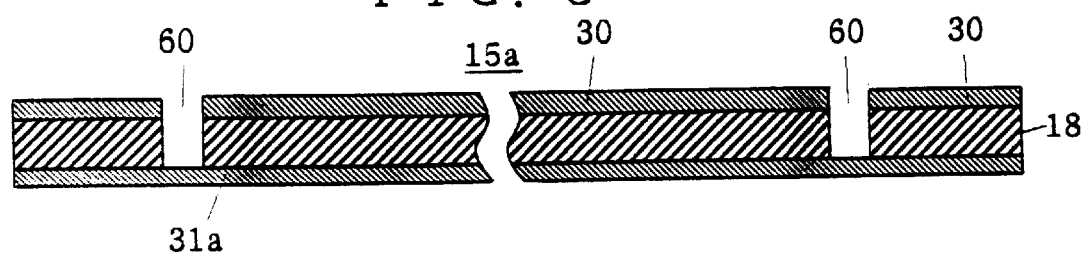
FIG. 3 is a sectional view showing a step in manufacturing the semiconductor device according to the first embodiment of the present invention.
Figure 4:
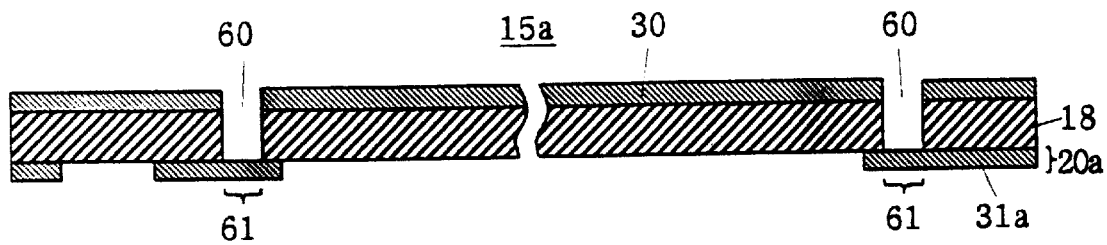
FIG. 4 is a sectional view showing a step in manufacturing the semiconductor device according to the first embodiment of the present invention.
Figure 47:
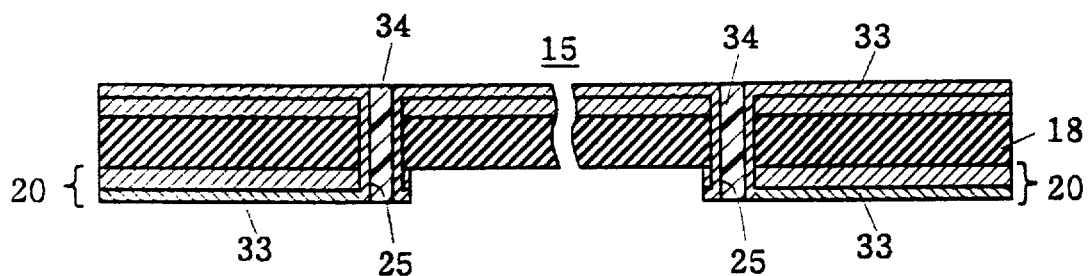
FIG. 47 is a sectional view showing a step in manufacturing the semiconductor device according to the prior art.

Then, a copper foil 31a is laminated on the other main surface of the insulating substrate 18 so that a double-sided printed circuit board 15a is formed (see FIG. 3). As shown in FIG. 4, the copper foil 31a of a wiring layer 20a is patterned. At this time, the copper foil 31a in a region 61 covering the hole 60 is not removed but left in place. In this case, the patterned wiring layer 20a includes only the copper foil 31a. Consequently, the pitch of a wiring pattern can be smaller than the pitch of the pattern of the wiring layer 20 shown in FIG. 47.

Figure 5:
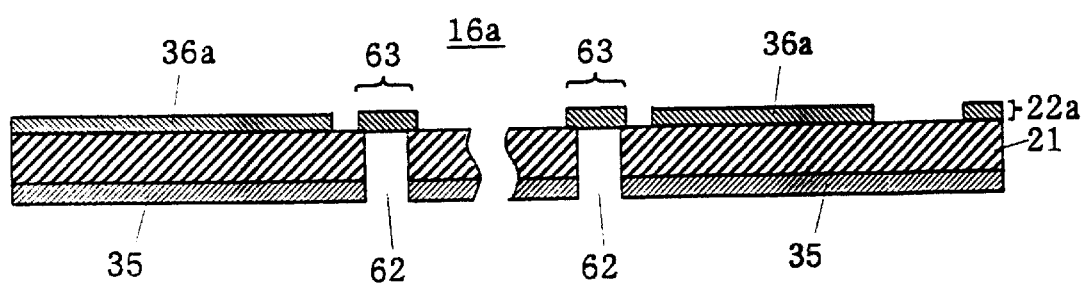
FIG. 5 is a sectional view showing a step in manufacturing the semiconductor device according to the first embodiment of the present invention.
Figure 6:
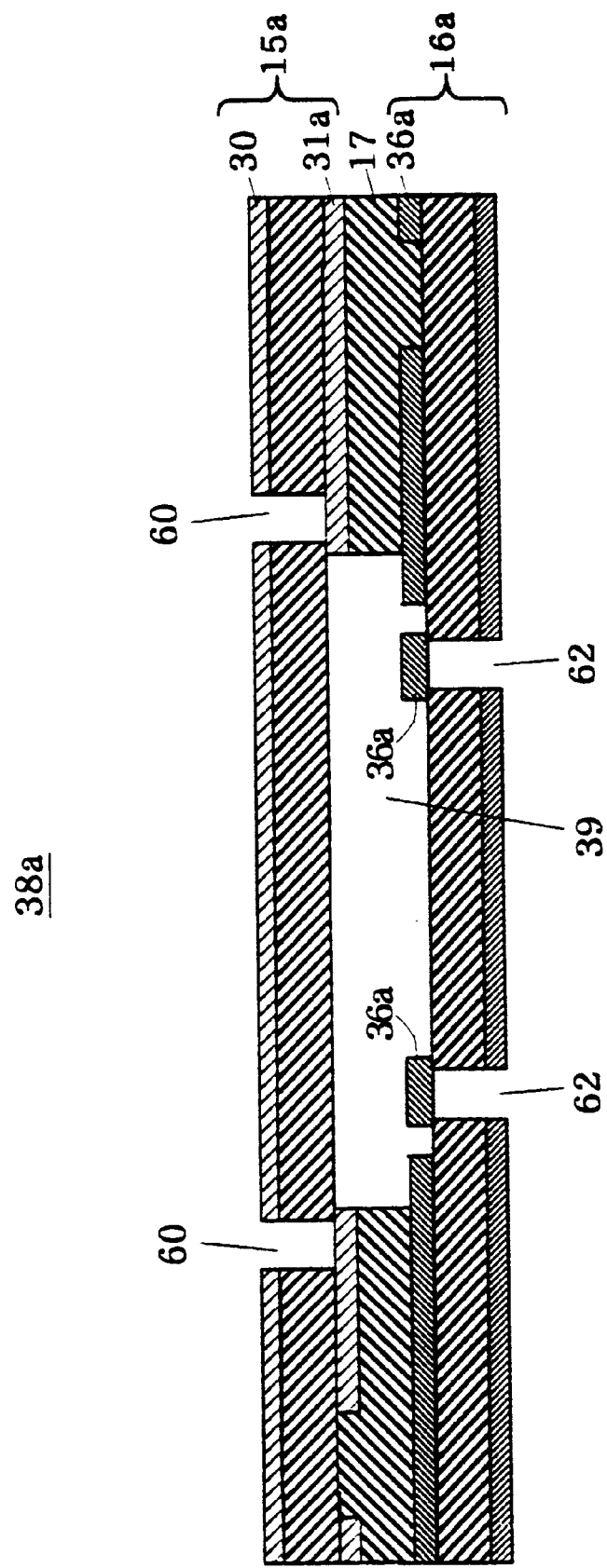
FIG. 6 is a sectional view showing a step in manufacturing the semiconductor device according to the first embodiment of the present invention.
Figure 48:
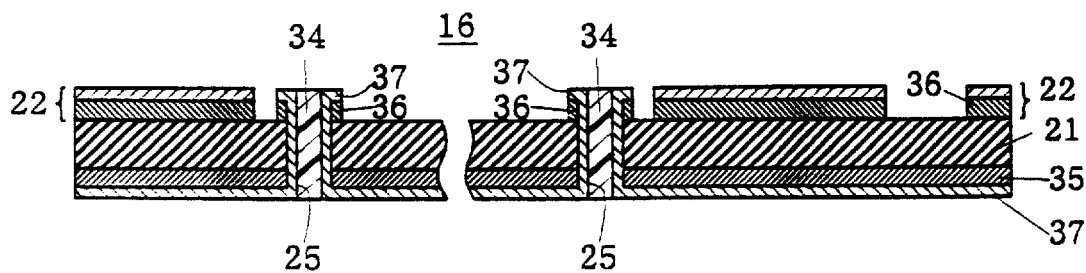
FIG. 48 is a sectional view showing a step in manufacturing the semiconductor device according to the prior art.
Figure 49:
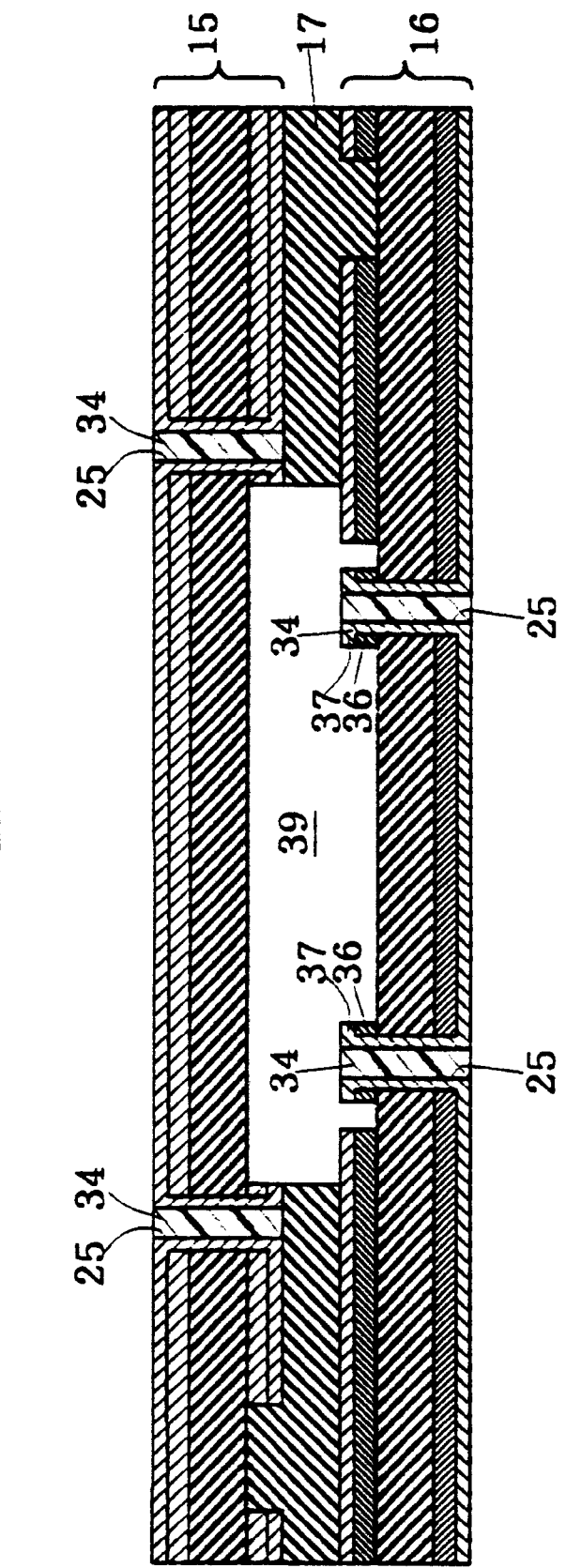
FIG. 49 is a sectional view showing a step in manufacturing the semiconductor device according to the prior art.
Figure 50:
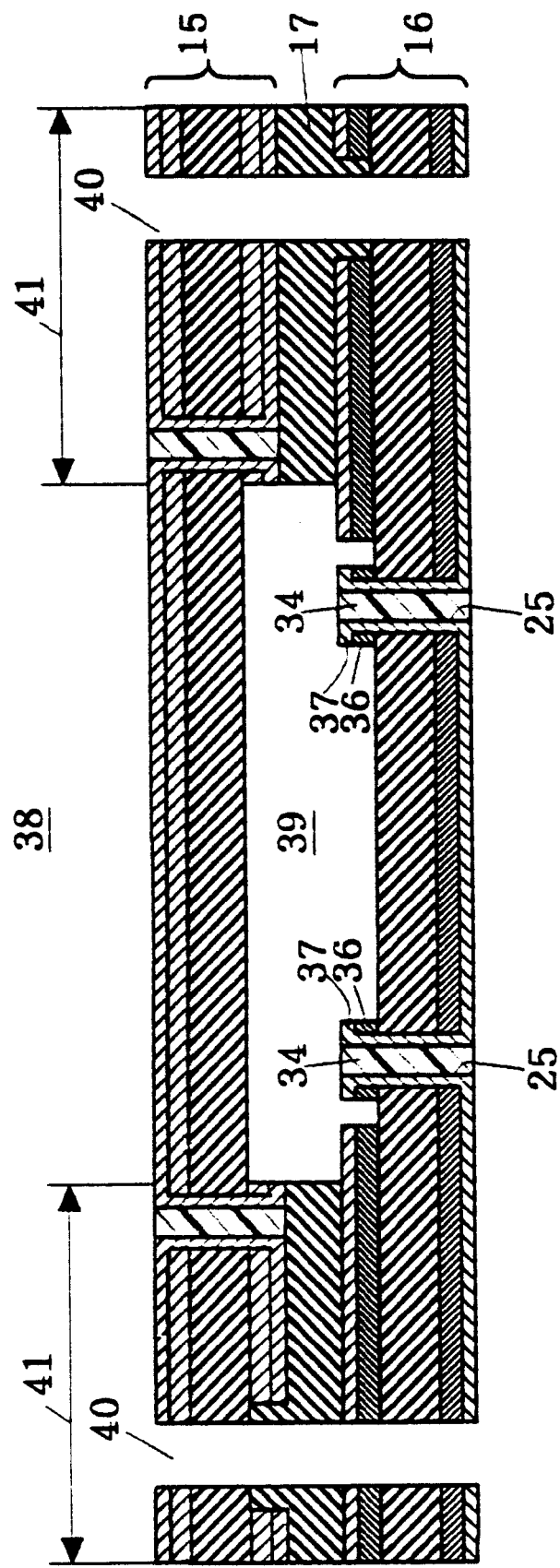
FIG. 50 is a sectional view showing a step in manufacturing the semiconductor device according to the prior art.
Figure 51:
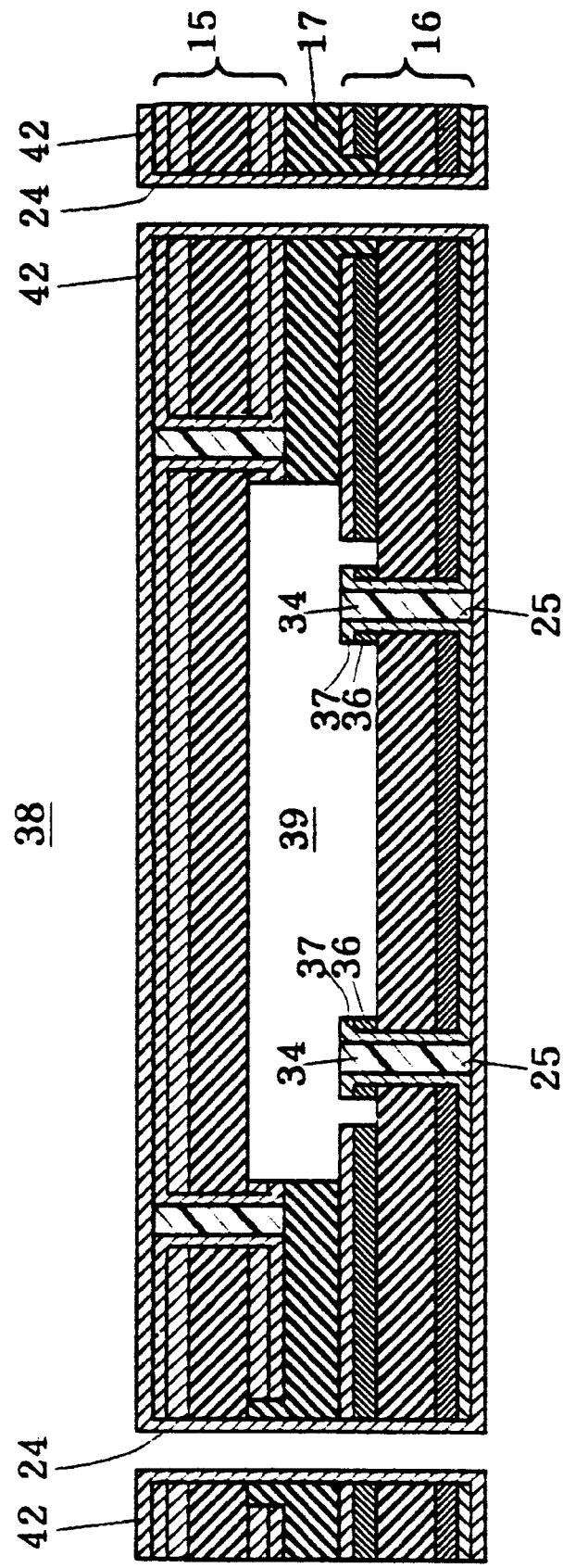
FIG. 51 is a sectional view showing a step in manufacturing the semiconductor device according to the prior art.
Figure 52:
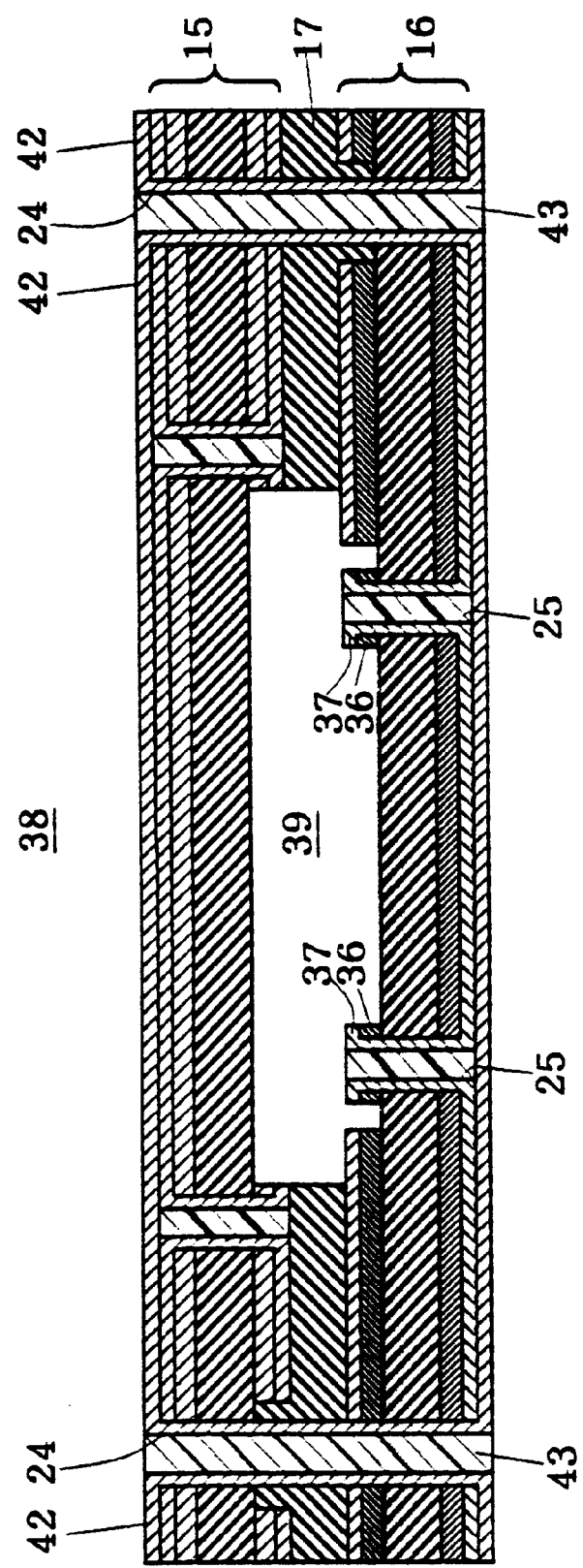
FIG. 52 is a sectional view showing a step in manufacturing the semiconductor device according to the prior art.

After performing the same steps as shown in FIGS. 1 to 4, a double-sided printed circuit board 16a is prepared including a hole 62 for an interstitial via hole and a patterned wiring layer 22a (see FIG. 5). A copper foil 36a in a region 63 where the hole 62 for the interstitial via hole is formed remains in place. The patterned wiring layer 22a includes only the copper foil 36a. Consequently, the pitch of a wiring pattern can be smaller than in the patterned wiring layer 22 shown in FIG. 48.

Figure 7:
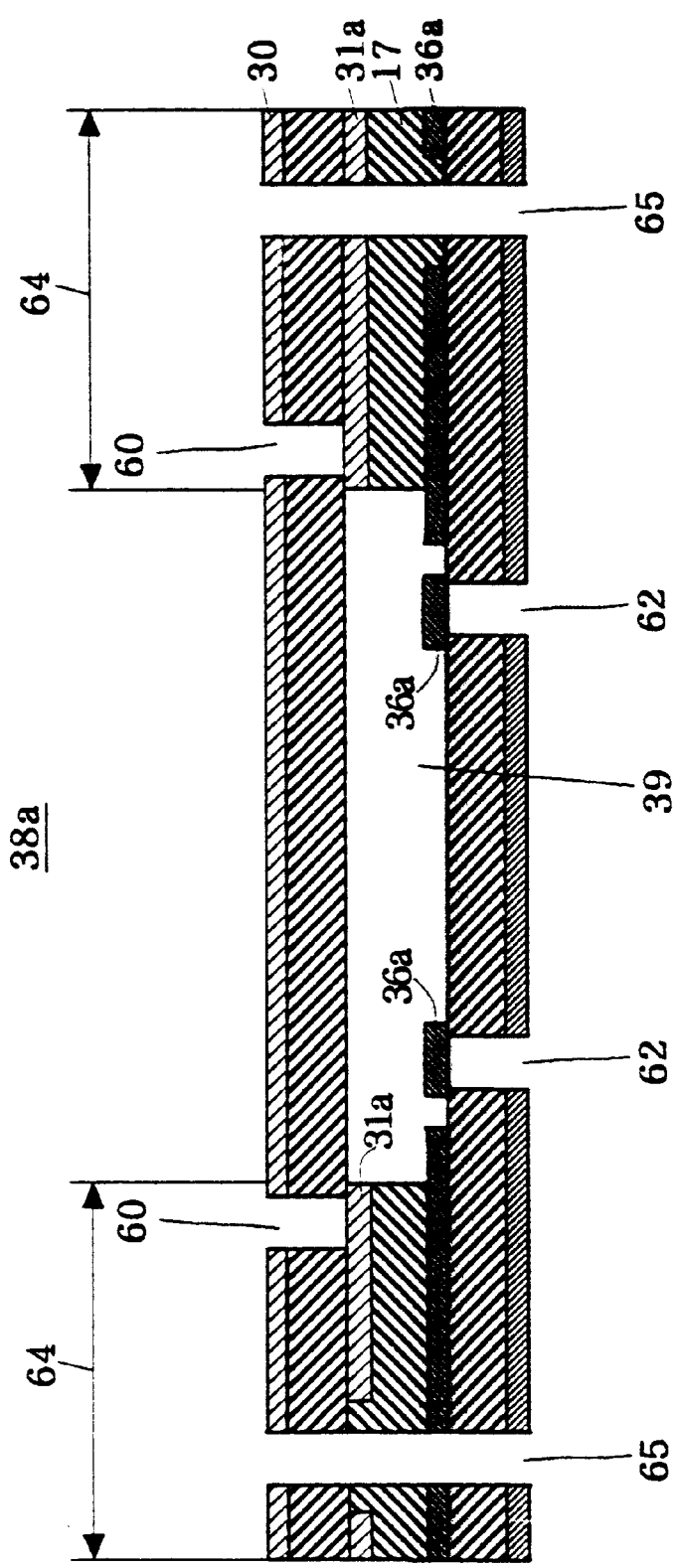
FIG. 7 is a sectional view showing a step in manufacturing the semiconductor device according to the first embodiment of the present invention.

The double-sided printed circuit board 15a shown in FIG. 4 is bonded to a double-sided printed circuit board 16a shown in FIG. 5 with a prepreg 17. Consequently, a laminated printed circuit board 38a is an aggregate of the double-sided printed circuit boards 15a and 16a (see FIG. 6). The prepreg 17 is not present in some regions, so that a chamber 39 for forming a cavity is located between the double-sided printed circuit boards 15a and 16a in the central portion of the laminated printed circuit board 38a. A hole 65 is located in a region 64 of the laminated printed circuit board 38a where the prepreg 17 is inserted. The hole 65 penetrates through the laminated printed circuit board 38a (see FIG. 7). The laminated printed circuit board 38a with the hole 65 is plated with a copper plated layer 66. Thus, a through hole 24 and an interstitial via hole 25a are formed (see FIG. 8). It is apparent that the metal surfaces of the copper foils 31a and 36a are exposed and contact the copper plated layer 66 after cleaning according to the prior art. The laminated printed circuit board 38a is immersed in a plating solution to be plated with copper. As shown in FIG. 7, the holes 60 and 62 for the interstitial via holes are closed by the copper foils 31a and 36a so that the chamber 39 is sealed. Consequently, the plating solution does not invade the chamber 39.

Figure 9:
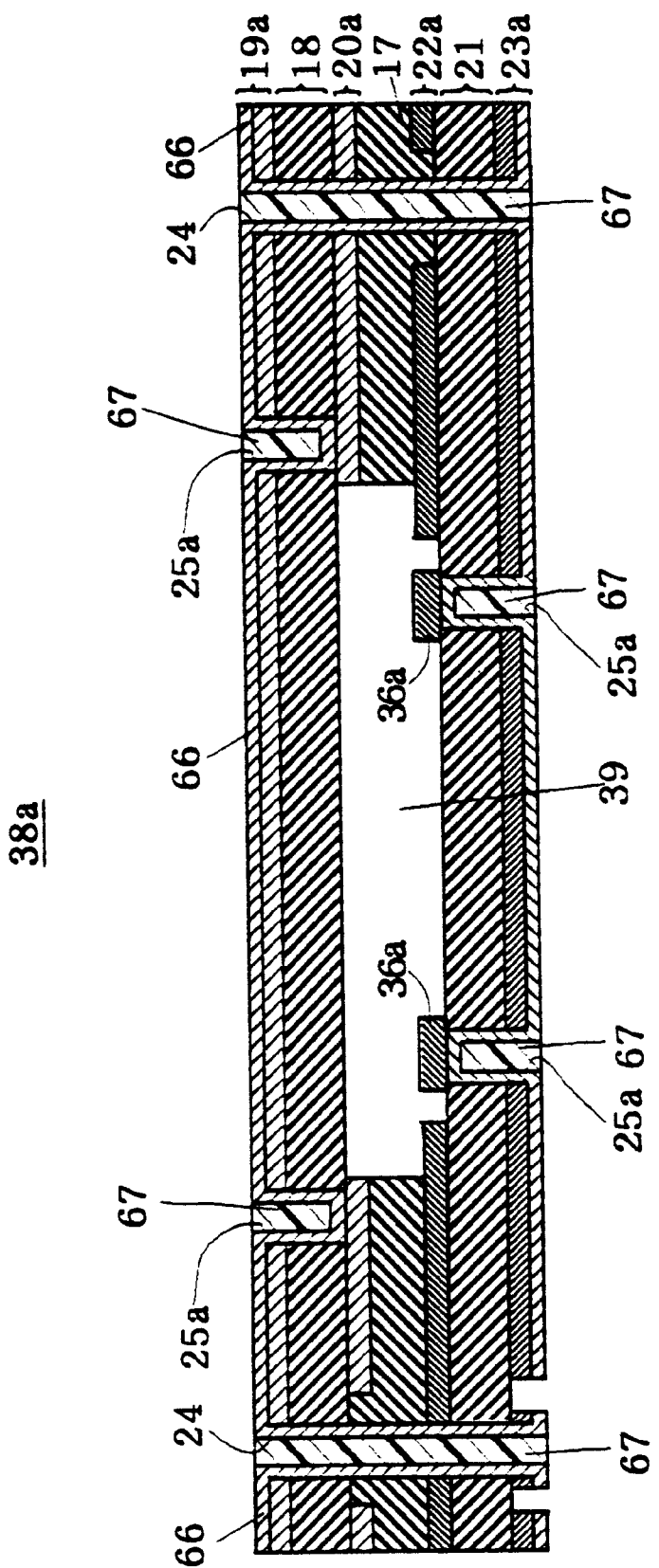
FIG. 9 is a sectional view showing a step in manufacturing the semiconductor device according to the first embodiment of the present invention.
Figure 53:
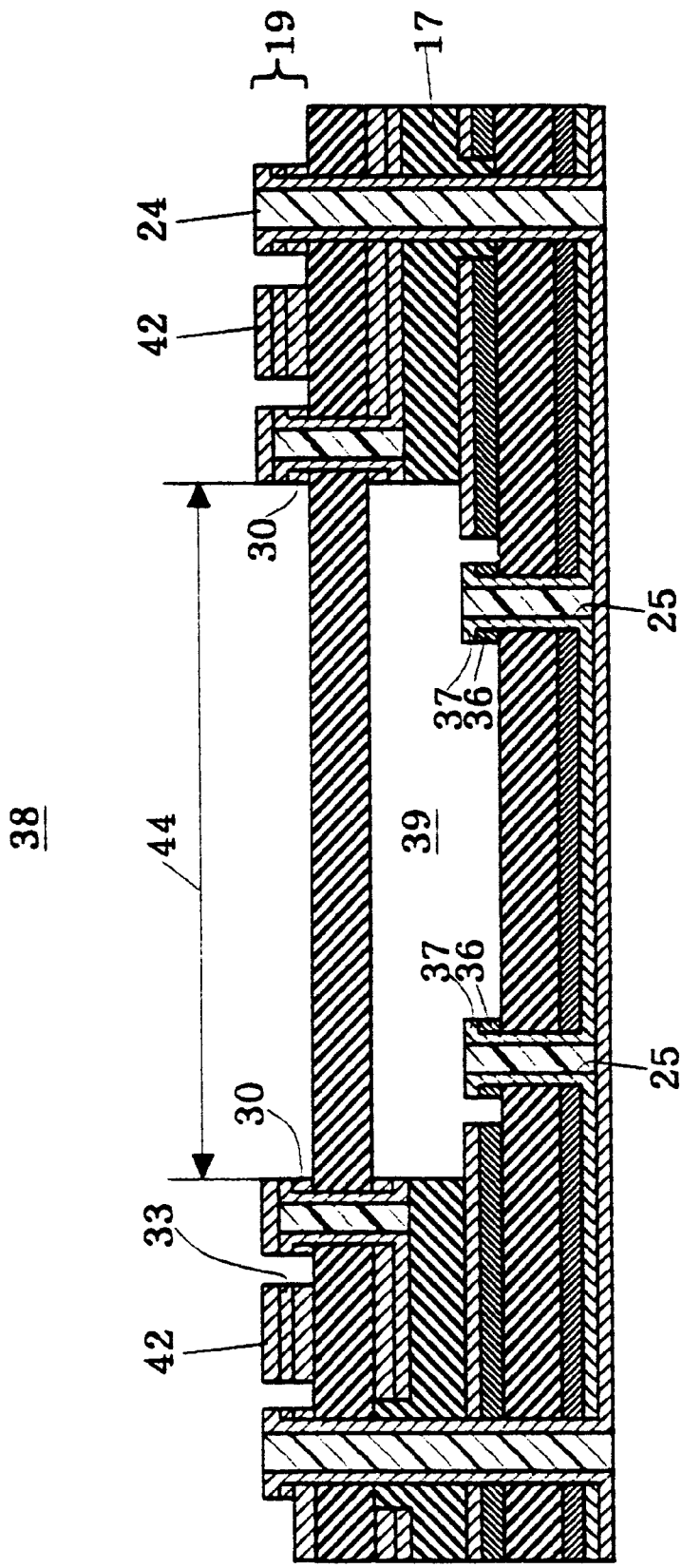
FIG. 53 is a sectional view showing a step in manufacturing the semiconductor device according to the prior art.
Figure 54:
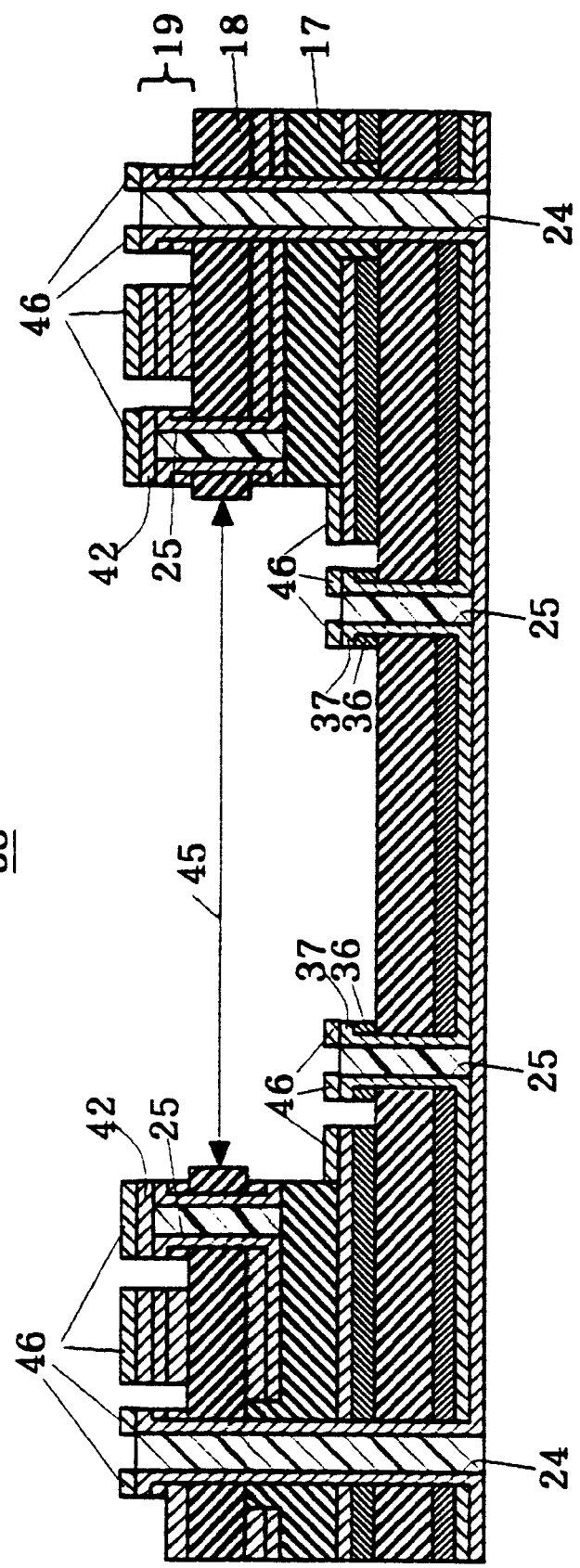
FIG. 54 is a sectional view showing a step in manufacturing the semiconductor device according to the prior art.

As shown in FIG. 9, the through hole 24 and the interstitial via hole 25a are filled with a resin 67. A wiring layer 19a is patterned (see FIG. 10). The copper foil 30 and the copper plated layer 66 located in an upper region 44 of the chamber 39 are also removed. The thickness of the patterned wiring layer 19a is smaller, by the thickness of a copper plated layer 42, than the wiring layer 19 according to the prior art, patterned as shown in FIG. 53. Consequently, it is easy, in the invention, to form a finer pattern.

The insulating substrate 18 in the upper region 44 is machined with a router to form an opening 45. After that, a nickel-gold plated layer 69 is plated on the copper plated layers 36a and 66 (see FIG. 11).

Figure 12:
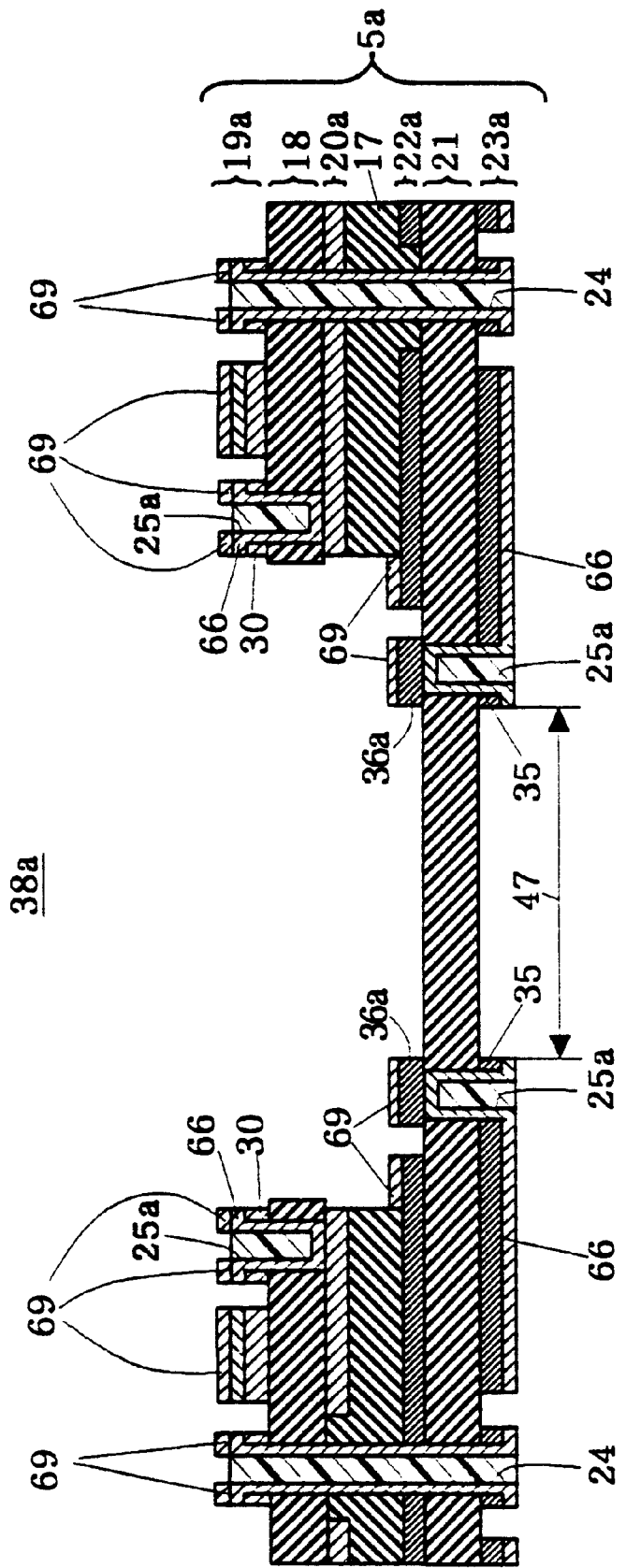
FIG. 12 is a sectional view showing a step in manufacturing the semiconductor device according to the first embodiment of the present invention.
Figure 55:
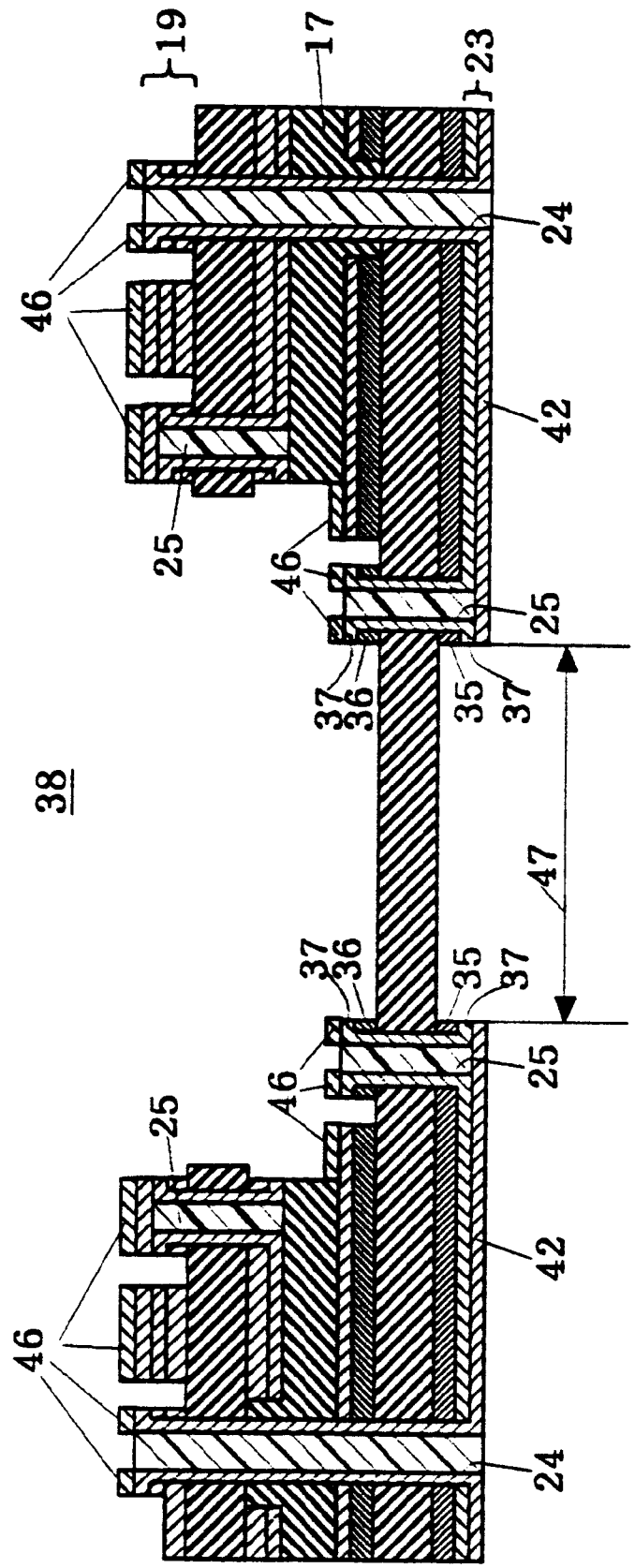
FIG. 55 is a sectional view showing a step in manufacturing the semiconductor device according to the prior art.
Figure 56:
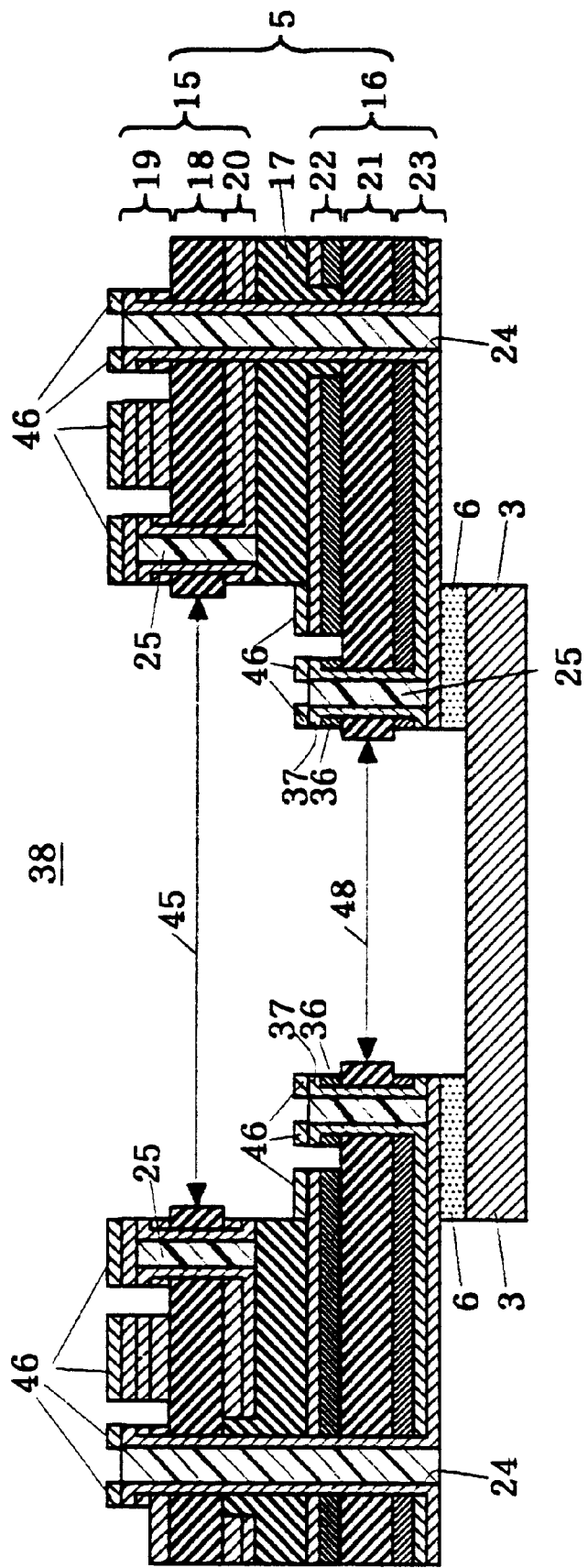
FIG. 56 is a sectional view showing a step in manufacturing the semiconductor device according to the prior art.
Figure 57:
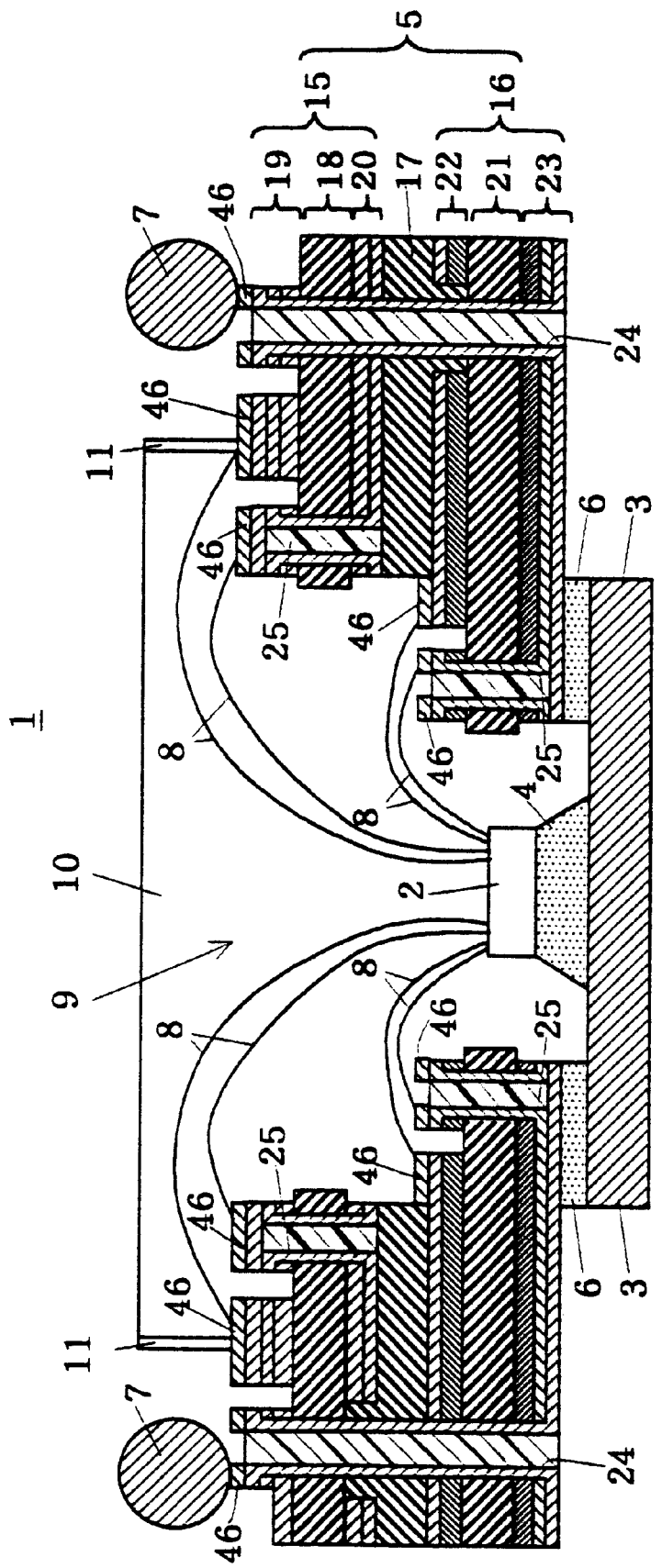
FIG. 57 is a sectional view showing a step in manufacturing the semiconductor device according to the prior art.
Figure 58:
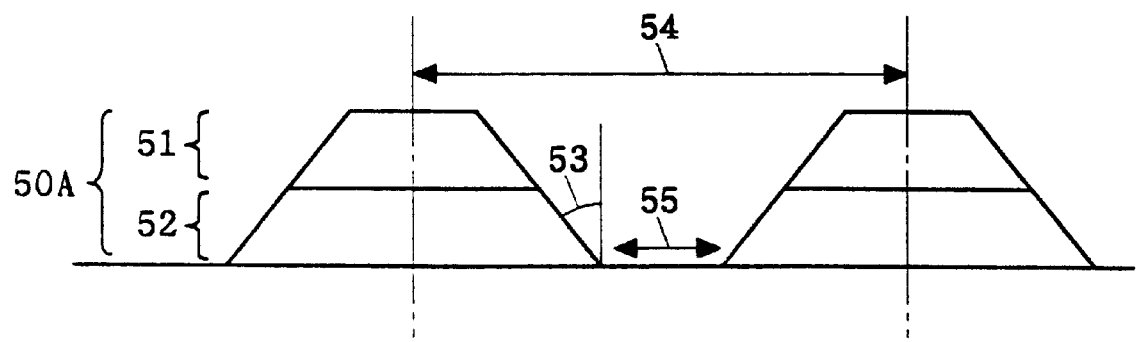
FIG. 58 is a sectional view for explaining the relationship of the thickness of a wiring with a space between wirings.
Figure 59:
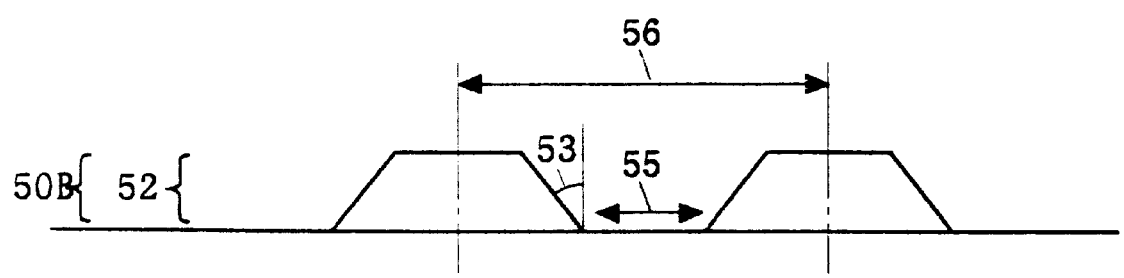
FIG. 59 is a sectional view for explaining the relationship of the thickness of the wiring with the space between wirings.

Then, a wiring layer 23a is patterned as shown in FIG. 12 and a copper foil 35 and the copper plated layer 66 in a region 47 below the chamber 39 are removed. The patterned wiring layer 23a includes the copper foil 35 and the copper plated layer 66, and has a thickness which is smaller, by the thickness of a copper plated layer 42, than the wiring layer 23 according to the prior art patterned as shown in FIG. 55. Consequently, it is easy to make the pattern of the wiring layer 23a finer.

Figure 13:
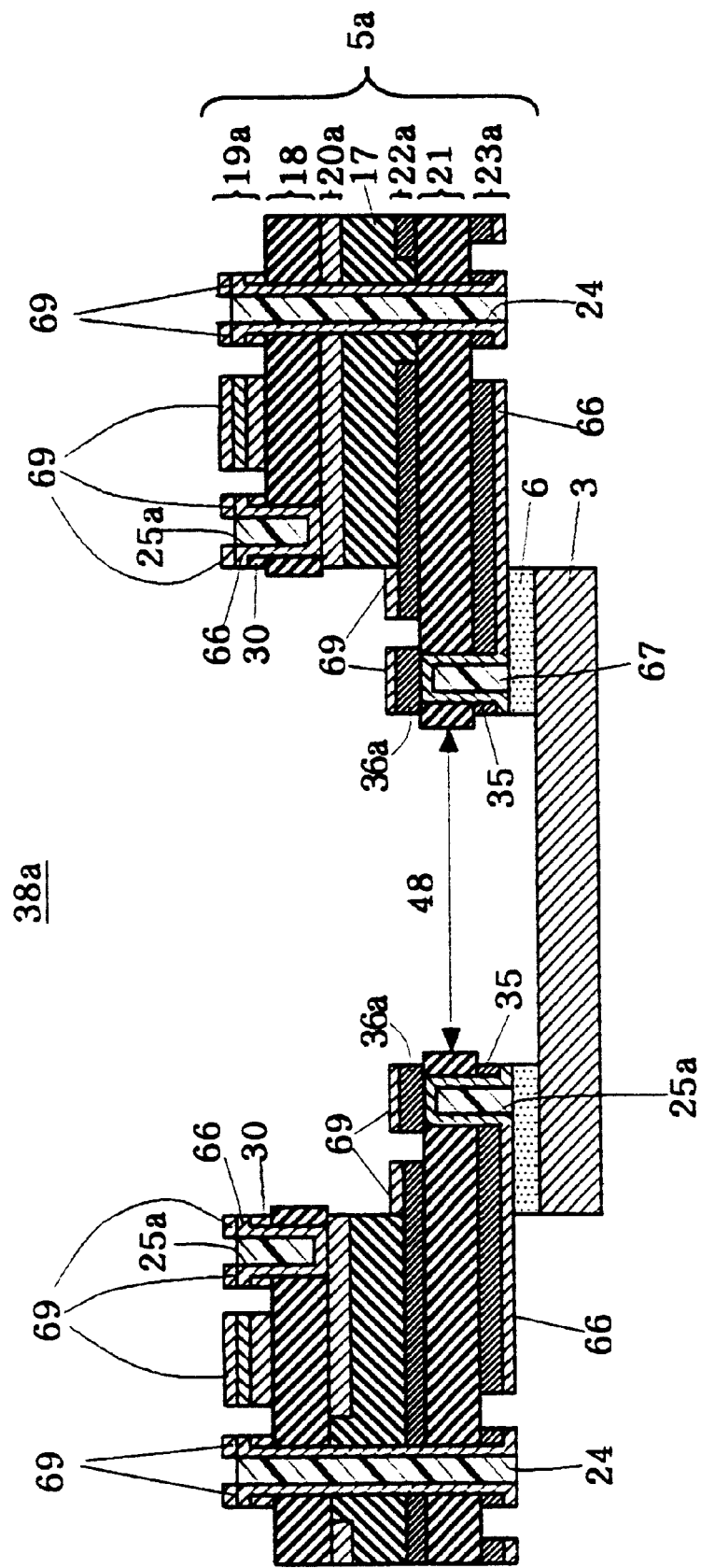
FIG. 13 is a sectional view showing a step in manufacturing the semiconductor device according to the first embodiment of the present invention.

As shown in FIG. 13, an opening 48 is formed in the region 47 so that a frame 5a is completed. A slug 3 is bonded to the frame 5a with an adhesive 6.

Figure 14:
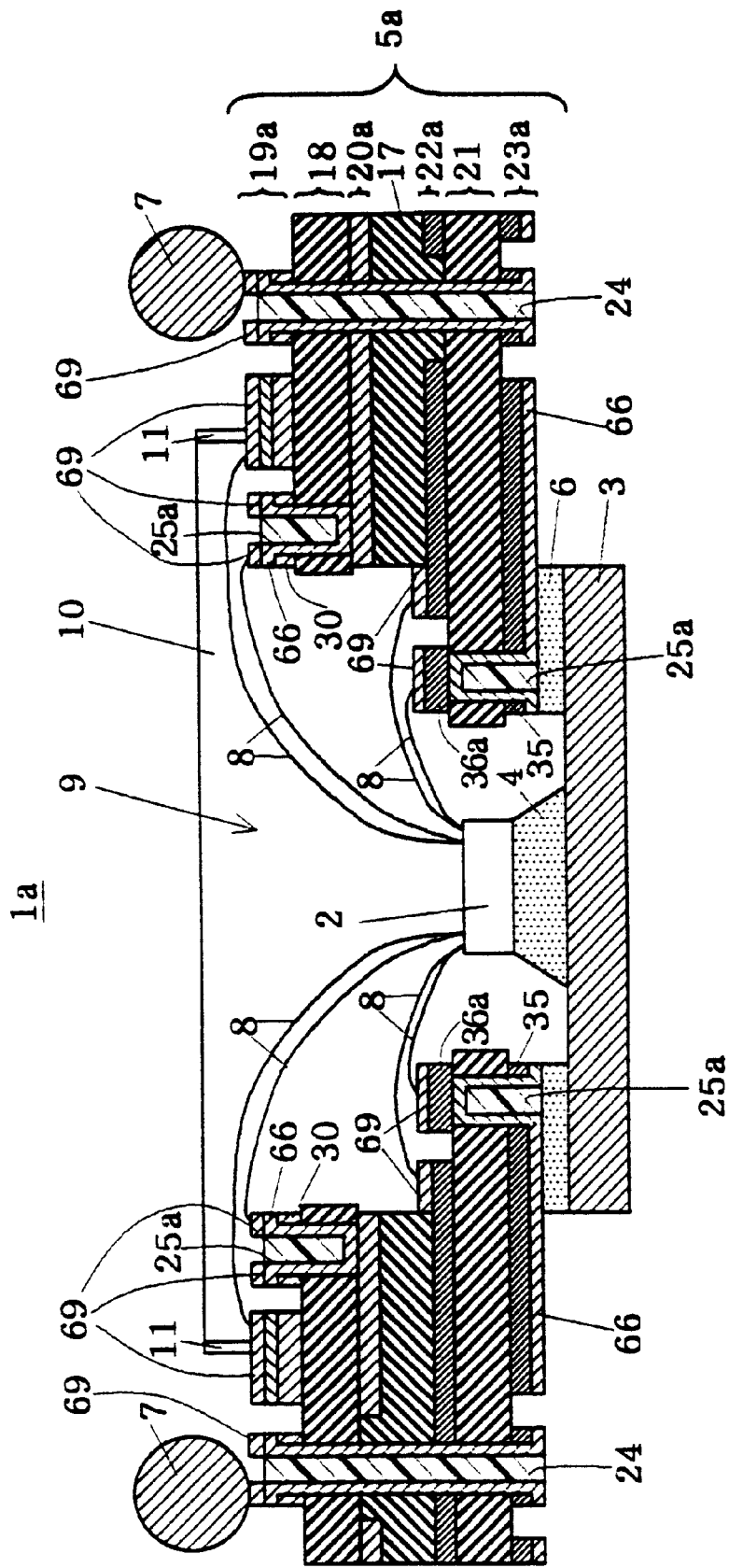
FIG. 14 is a sectional view showing a step in manufacturing the semiconductor device according to the first embodiment of the present invention.

As shown in FIG. 14, a chip 2 is bonded to the slug 3 with a die bonding resin 4 and is connected to a nickel-gold plated layer 69 by a wire 8. After a dam 11 is attached, a cavity 9 is filled with a sealing resin 10, sealing the package. Then, a solder ball 7 is formed on the nickel-gold plated layer of the wiring layer 19a. Thus, a semiconductor device 1a having a printed circuit board BGA package is completed.

Figure 16:
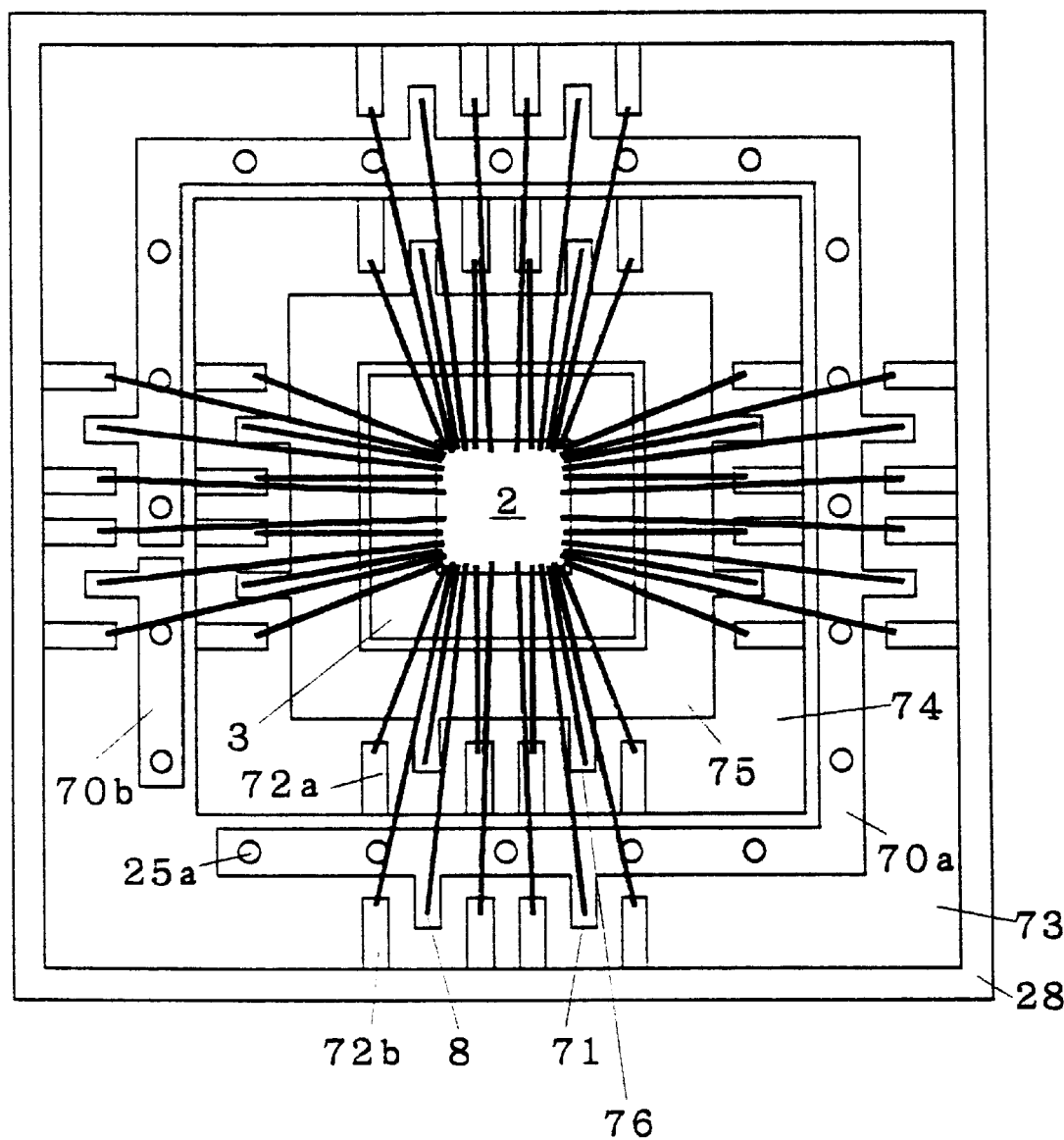
FIG. 16 is a plan view showing the structure of the semiconductor device according to the first embodiment of the present invention.
Figure 17:
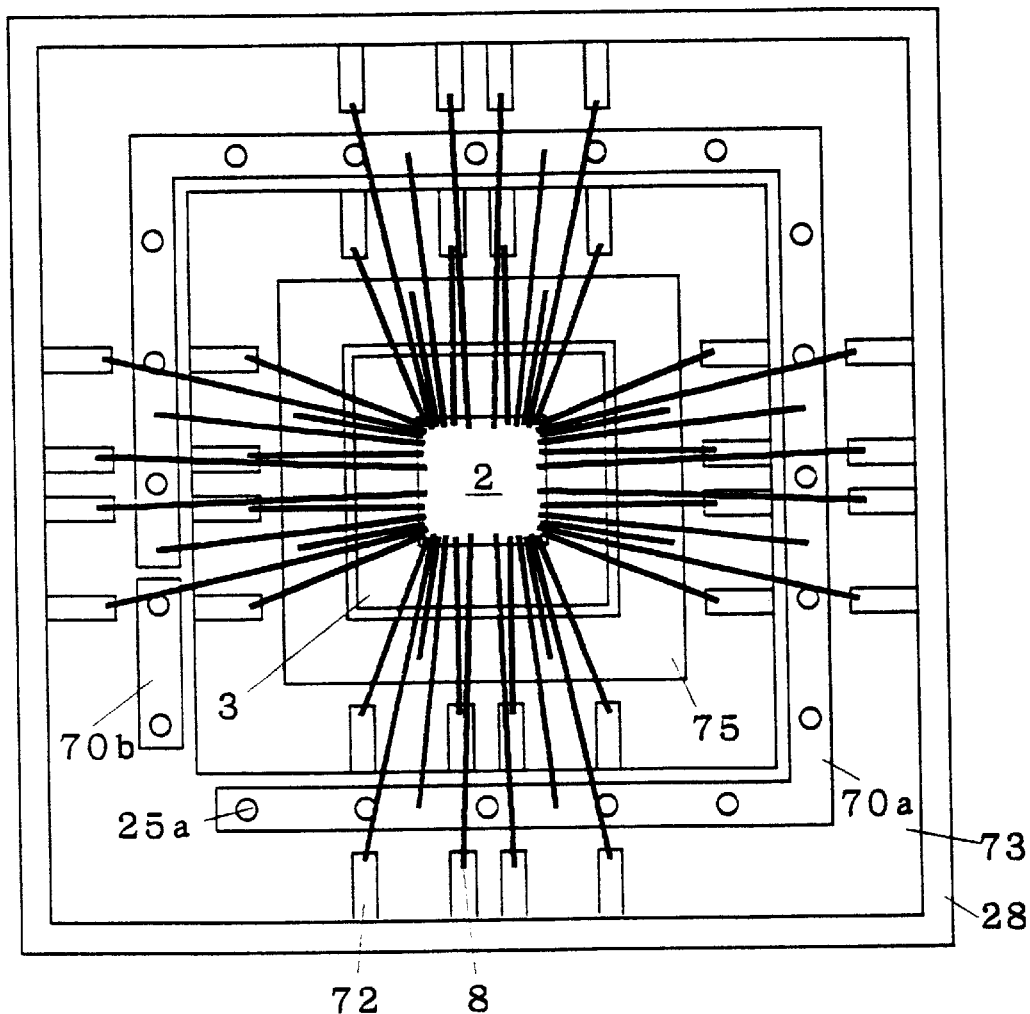
FIG. 17 is a plan view showing the structure of the semiconductor device according to the first embodiment of the present invention.

FIG. 15 is a perspective view showing the structure of the printed circuit board BGA package shown in FIG. 14. In FIG. 15, the resin 10 shown in FIG. 14 is omitted or the resin 10 has not been injected. In FIG. 15, the same reference numerals designate the same portions as in FIG. 14. FIG. 16 is an enlarged plan view showing the central portion of the printed circuit board BGA package shown in FIG. 15. In FIG. 16, reference numerals 70a and 70b designate power source-ground rings on an upper stage 73 supplying a source voltage and a ground voltage, respectively, reference numeral 71 designates a wire bonding pad protruding from the power source-ground rings 70a and 70b to arrange stitch bonding positions, reference numeral 72a designates a wire bonding pad on a lower stage 74 of the frame 5a, reference numeral 72b designates a wire bonding pad on the upper stage 73 of the frame 5a, reference numeral 75 designates a power source-ground plane on the lower stage 74 and supplying a source voltage or a ground voltage, respectively, reference numeral 76 designates a wire bonding pad protruding from the power source-ground plane 75 to arrange the stitch positions, and the same reference numerals designate the same portions as in FIG. 14. FIG. 17 is a plan view showing another example of the printed circuit board BGA package shown in FIG. 15 in which the stitch bonding positions are different from those in FIG. 16. In the printed circuit board BGA package shown in FIG. 17, the wire bonding pads 71 and 76 are absent and the wire bonding positions are on the ring. It is apparent that the first embodiment can also be applied to the printed circuit board BGA packages having the structures shown in FIGS. 16 and 17.

Figure 10:
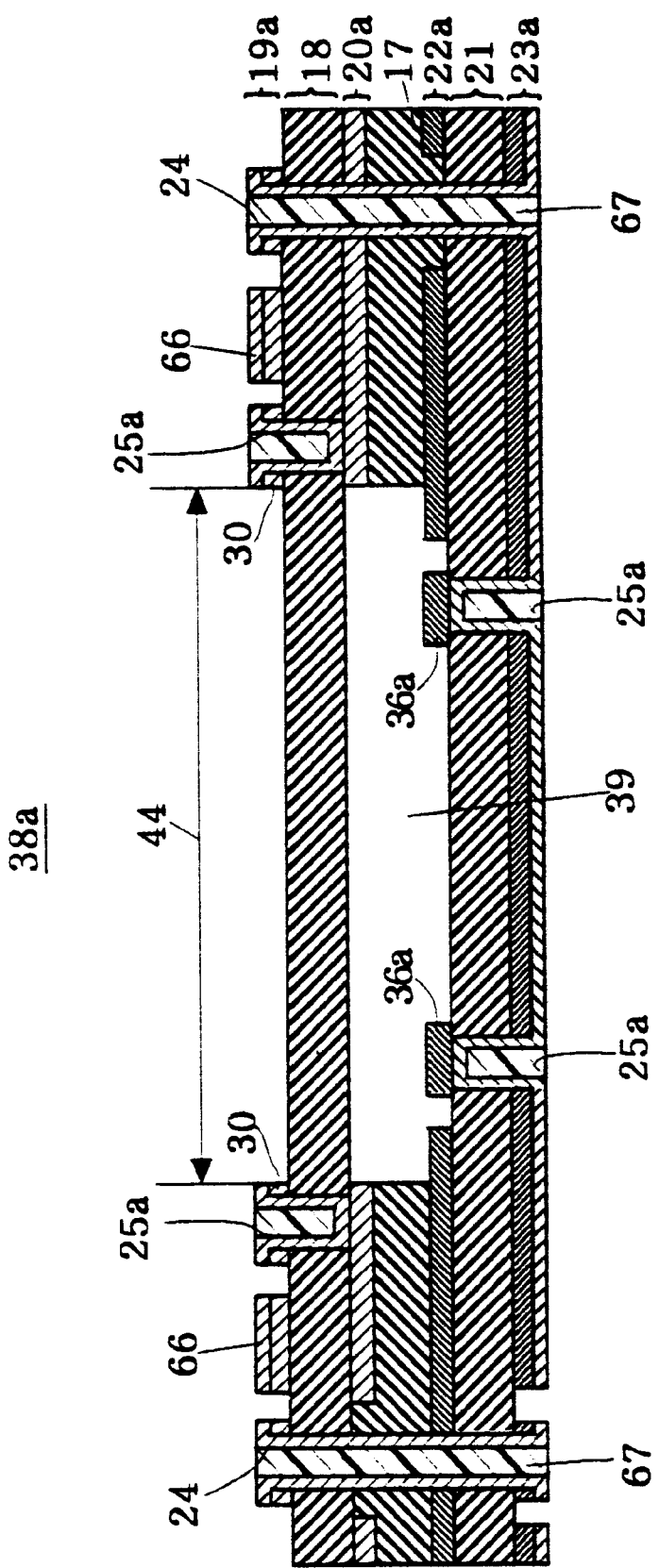
FIG. 10 is a sectional view showing a step in manufacturing the semiconductor device according to the first embodiment of the present invention.
Figure 11:
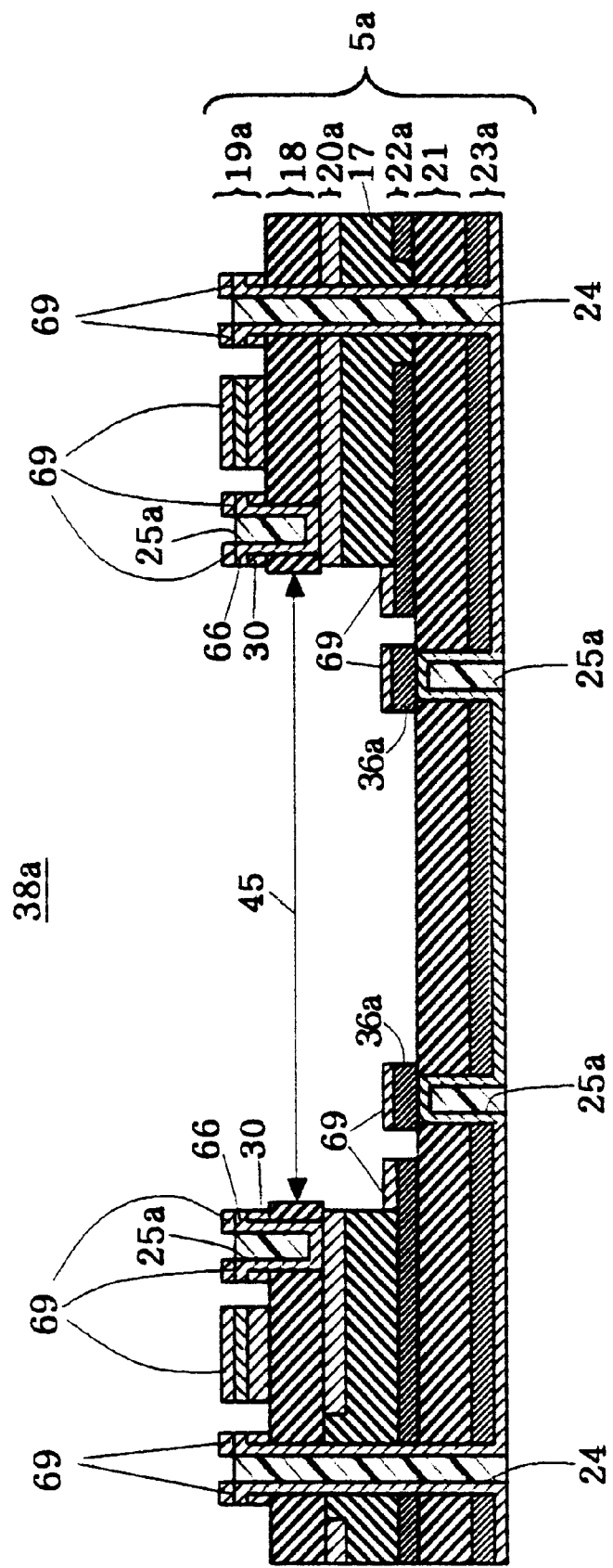
FIG. 11 is a sectional view showing a step in manufacturing the semiconductor device according to the first embodiment of the present invention.

In a method for manufacturing a semiconductor device according to the first embodiment, the copper foil 30 and the copper plated layer 66 or the copper foil 35 and the copper plated layer 66 of the wiring layers 19a and 23a are patterned in the steps shown in FIGS. 10 and 12. Consequently, it is easy to make the pattern finer. Also, where the wiring layers 20a and 22a are etched as shown in FIGS. 4 and 5, the copper plated layer is not formed on the copper foils 31a and 36a. Therefore, it is possible to perform finer patterning than in the prior art.

The manufacturing steps shown in FIGS. 1 to 14 are compared with the manufacturing steps shown in FIGS. 43 to 57. In the steps according to the prior art, the through hole 24 and the interstitial via hole 25 are formed and filled with a resin separately. On the contrary, the through hole 24 and the interstitial via hole 25a are simultaneously formed and filled with the resin at the steps shown in FIGS. 1 to 14. Consequently, the process is simplified.

Figure 8:
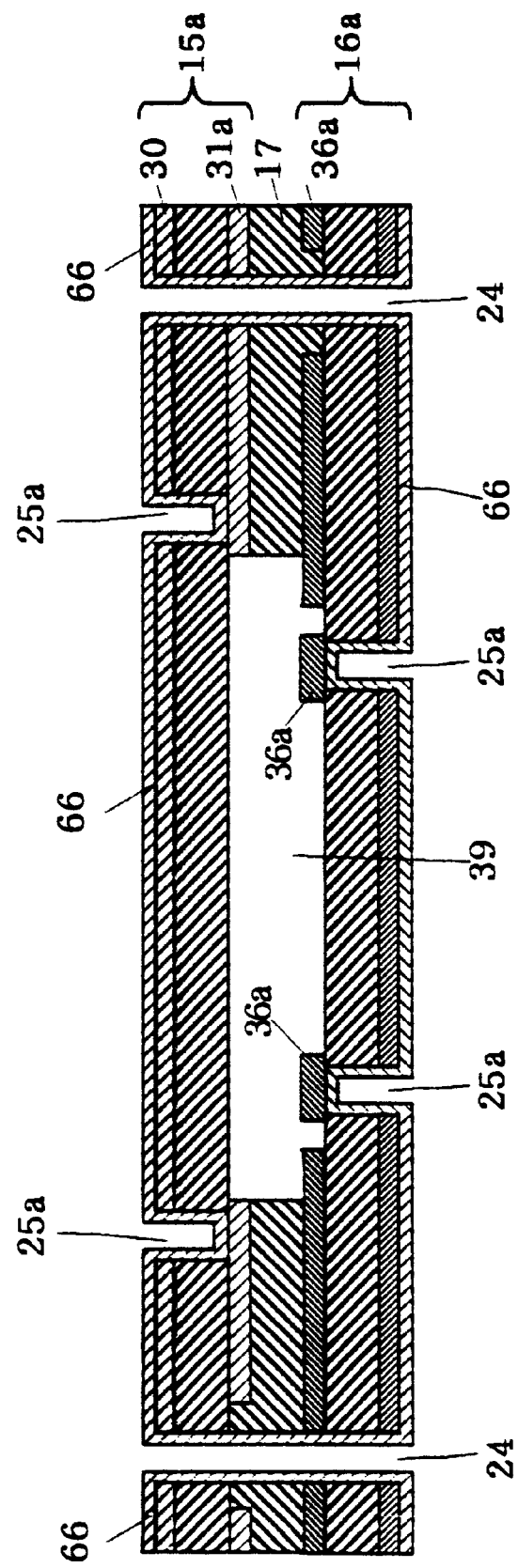
FIG. 8 is a sectional view showing a step in manufacturing the semiconductor device according to the first embodiment of the present invention.

As compared with the semiconductor device according to the prior art, the interstitial via hole 25a is covered with the copper foils 31a and 36a in the semiconductor device according to the first embodiment. Consequently, both sides of the double-sided printed circuit board are blocked and the plating solution is prevented from invading during manufacture. Thus, manufacture can be performed easily. If it is not necessary to wire bond to a conductor pattern on the interstitial via hole 25a of the double-sided printed circuit board 16a and to apply a solder resist, filling of the interstitial via hole 25a with a resin may be omitted. If it is not necessary to apply the solder resist, filling of the through hole 24 and the interstitial via hole 25a of the double-sided printed circuit board 15a with a resin may be omitted. Where all the resin filling steps shown in FIG. 8 are omitted, the process can be simplified still more.

Second Embodiment

A method for manufacturing a semiconductor device according to a second embodiment of the present invention is described with reference to FIGS. 18 to 33. By sequentially performing the steps shown in FIGS. 18 to 33, the semiconductor device according to the second embodiment is completed.

Figure 18:
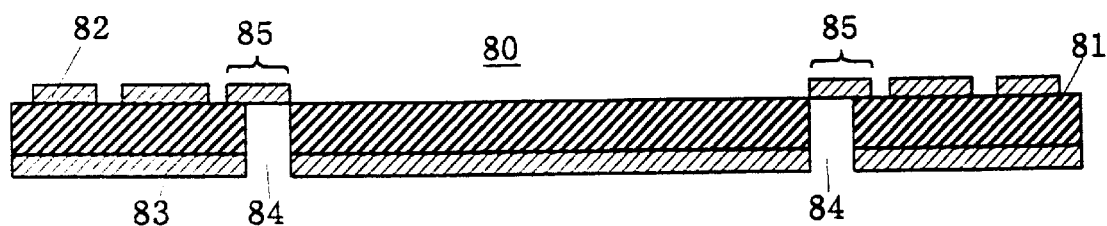
FIG. 18 is a sectional view showing a step in manufacturing a semiconductor device according to a second embodiment of the present invention.

After performing the steps shown in FIGS. 1 to 4, a double-sided printed circuit board 80 shown in FIG. 18 is prepared. The double-sided printed circuit board 80 comprises an insulating substrate 81. A patterned copper foil 82 is formed on one of main surfaces of the insulating substrate 81. A copper foil 83 is formed on the other main surface of the insulating substrate 81. The copper foil 82 is left in a region 85 where a hole 84 is formed so that the hole 84 is covered. The hole 84 penetrates the copper foil 83 and the insulating substrate 81.

Figure 19:
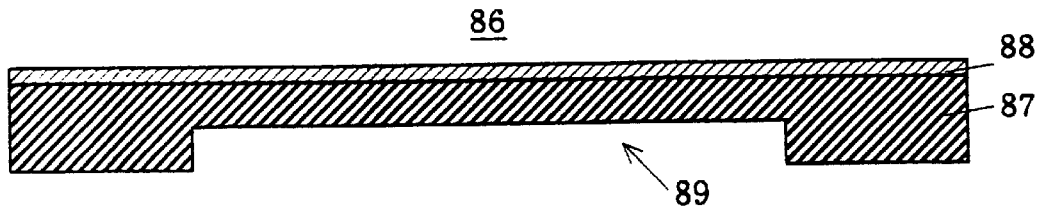
FIG. 19 is a sectional view showing a step in manufacturing the semiconductor device according to the second embodiment of the present invention.

As shown in FIG. 19, an insulating substrate 87 is formed. The insulating substrate 87 has a copper foil 88 on one of its main surfaces and a concave portion 89 on the other of its main surface.

Figure 20:
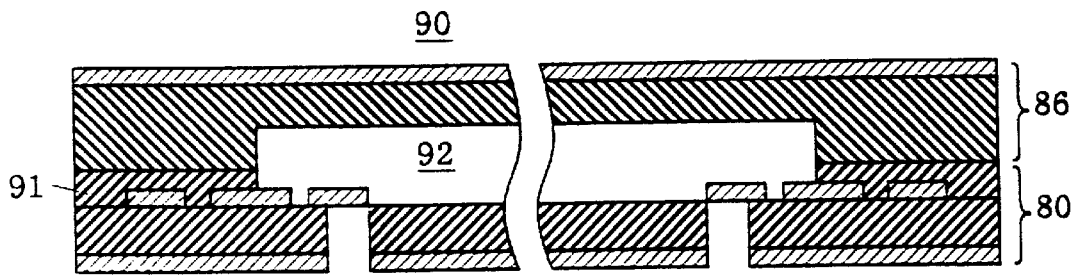
FIG. 20 is a sectional view showing a step in manufacturing the semiconductor device according to the second embodiment of the present invention.
Figure 21:
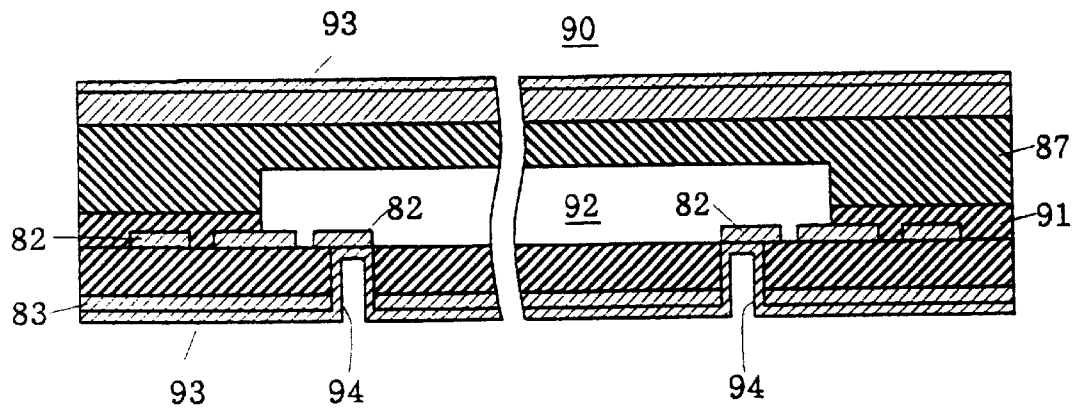
FIG. 21 is a sectional view showing a step in manufacturing the semiconductor device according to the second embodiment of the present invention.

One of the main surfaces of the double-sided printed circuit board 80 shown in FIG. 18 is bonded to the other main surface of the insulating substrate 87 shown in FIG. 19 with prepreg 91 so that a laminated printed circuit board 90 is formed (see FIG. 20). The laminated printed circuit board 90 comprises an insulating base, an insulating substrate and a copper foil. A chamber 92 is provided in the central portion of the laminated printed circuit board 90. The laminated printed circuit board 90 is plated with copper so that a copper plated layer 93 is formed on the copper foils 83 and 88. The copper plated layer 93 is formed in the hole 84. Consequently, an interstitial via hole 94 for connecting the copper foils 82 and 83 is formed (see FIG. 21). At this time, the hole 84 for an interstitial via hole is covered by the copper foil 82 as shown in FIG. 20. Therefore, plating solution is prevented from invading the chamber 92.

Figure 22:
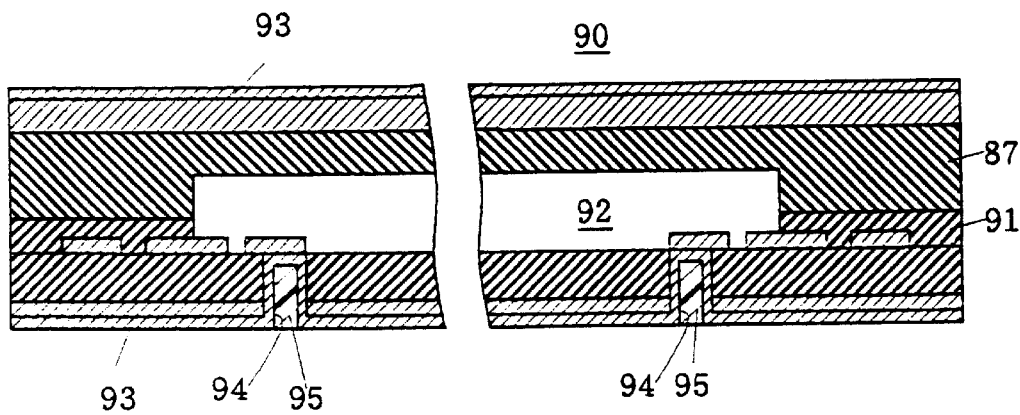
FIG. 22 is a sectional view showing a step in manufacturing the semiconductor device according to the second embodiment of the present invention.
Figure 23:
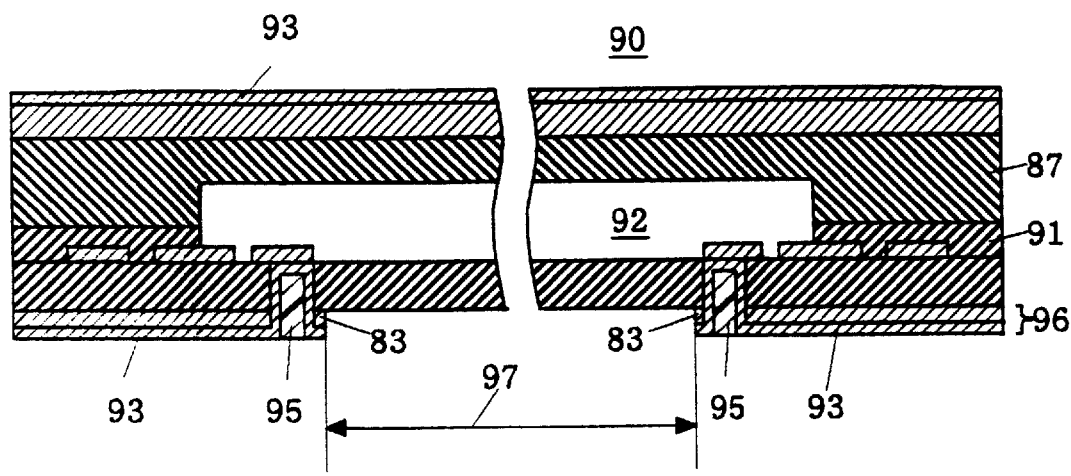
FIG. 23 is a sectional view showing a step in manufacturing the semiconductor device according to the second embodiment of the present invention.

As shown in FIG. 22, the interstitial via hole 94 is filled with a resin 95. A wiring layer 96 including the copper foil 83 and the copper plated layer 93 is patterned as shown in FIG. 23. The copper foil 83 and the copper plated layer 93 in a region 97 below the chamber 92 are removed simultaneously (see FIG. 24).

In the same manner as the double-sided printed circuit board 80 shown in FIG. 18, a double-sided printed circuit board 100 is prepared. The double-sided printed circuit board 100 comprises an insulating substrate 101. The insulating substrate 101 has a patterned copper foil 102 on one of its main surfaces, and a copper foil 103 on the other of its main surface. The copper foil 102 remains in a region 105 where a hole 104 is located so that the hole 104 is covered. The hole 104 penetrates the copper foil 103 and the insulating substrate 101.

Figure 24:
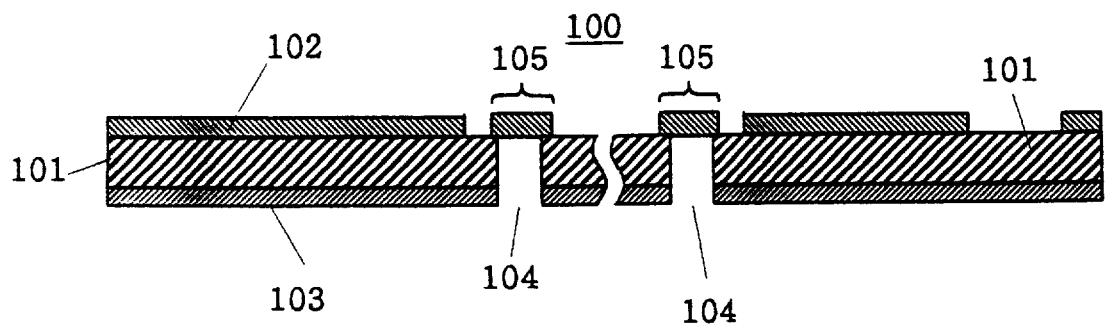
FIG. 24 is a sectional view showing a step in manufacturing the semiconductor device according to the second embodiment of the present invention.
Figure 25:
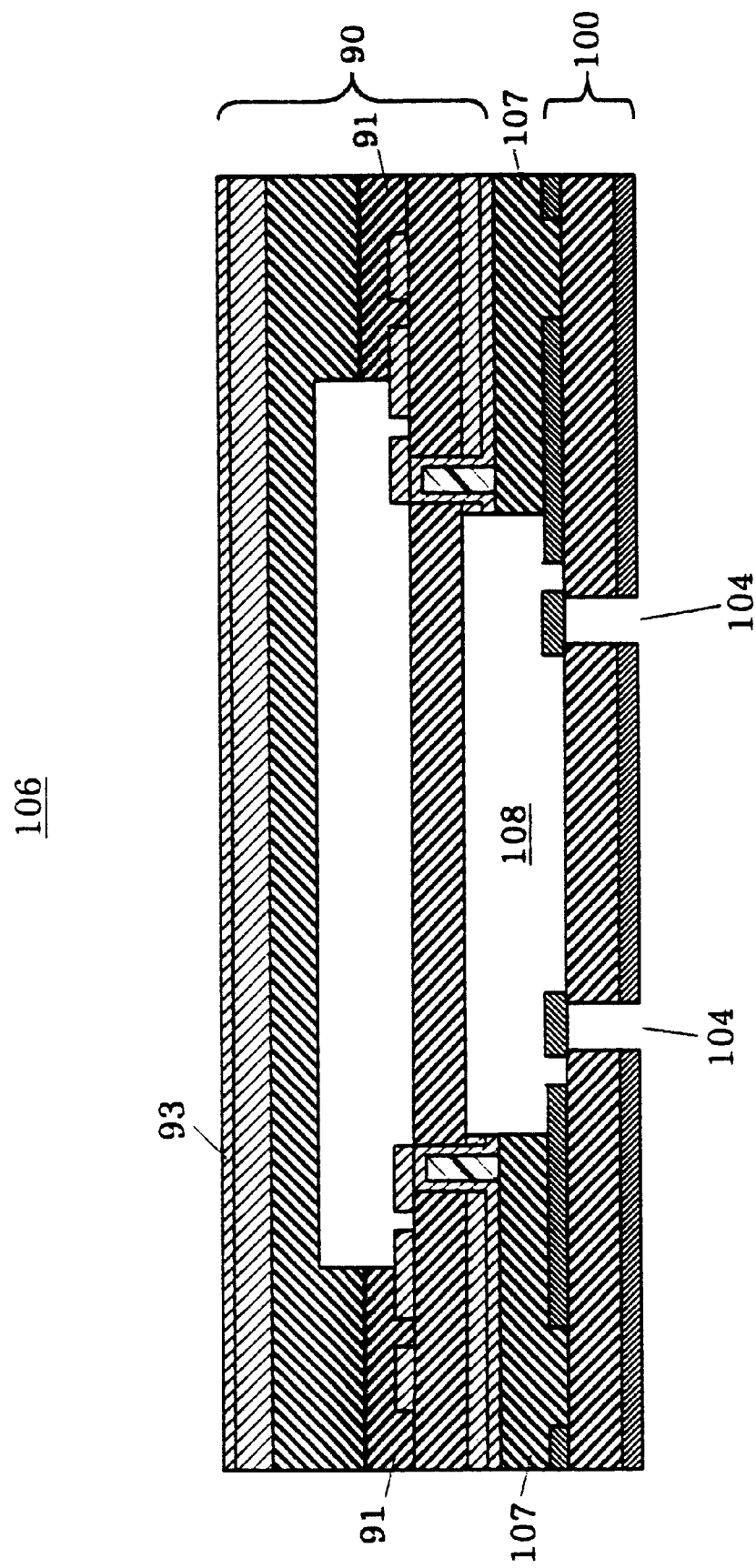
FIG. 25 is a sectional view showing a step in manufacturing the semiconductor device according to the second embodiment of the present invention.
Figure 26:
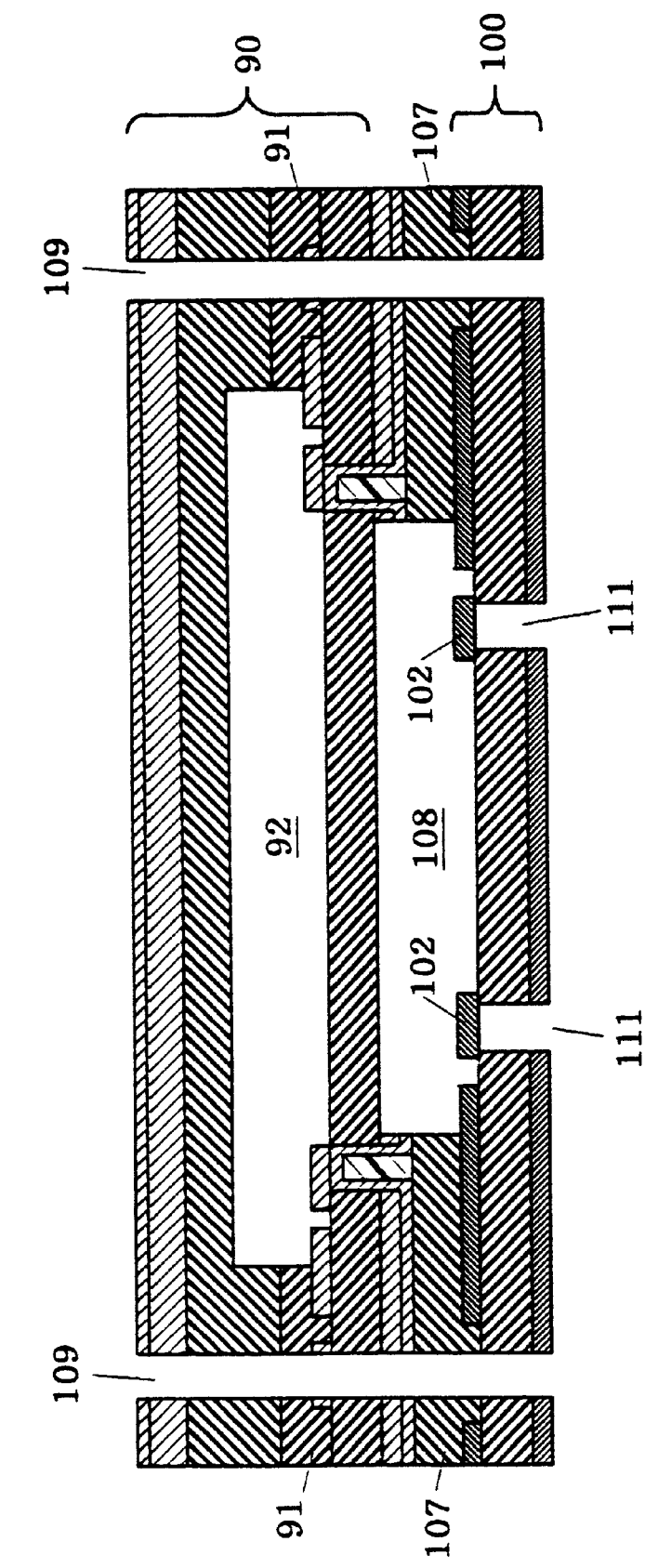
FIG. 26 is a sectional view showing a step in manufacturing the semiconductor device according to the second embodiment of the present invention.
Figure 27:
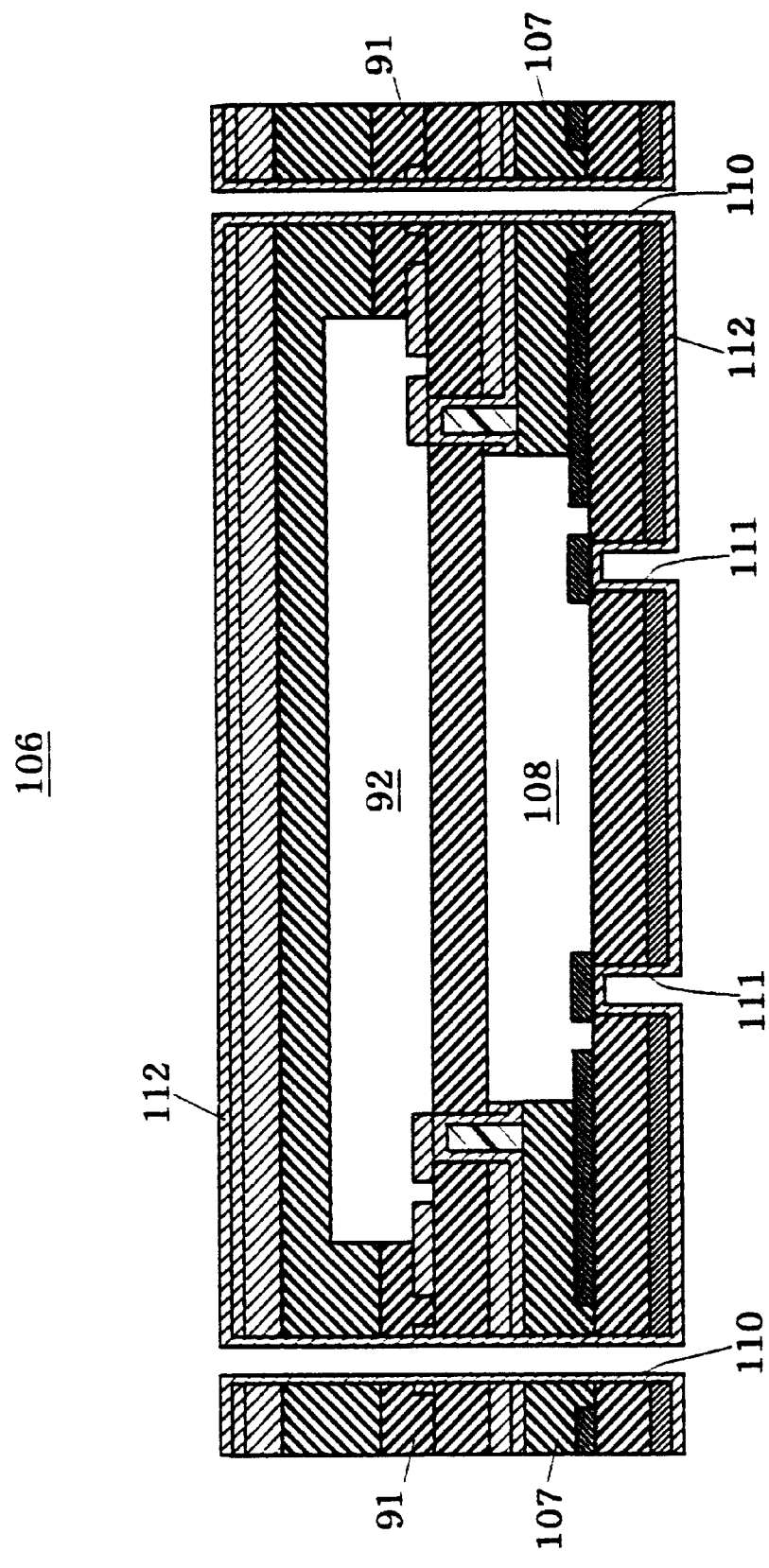
FIG. 27 is a sectional view showing a step in manufacturing the semiconductor device according to the second embodiment of the present invention.

One of the main surfaces of the double-sided printed circuit board 100 shown in FIG. 24 is bonded, with prepreg 107, to the other main surface side of the double-sided printed circuit board 80, forming the laminated printed circuit board 90 shown in FIG. 23. Thus, a laminated printed circuit board 106 includes an aggregate of the laminated printed circuit board 90 and the double-sided printed circuit board 100 (see FIG. 25). The prepreg 107 is not present in a chamber 108 forming a cavity between the double-sided printed circuit board 100 and the laminated printed circuit board 90 in the central portion of the laminated printed circuit board 106. A hole 109 penetrating the laminated printed circuit board 106 is located in regions of the laminated printed circuit board 106 where the prepregs 91 and 107 are present (see FIG. 26). Then, the laminated printed circuit board 106 including the hole 109 is plated with copper to form a copper plated layer 112. Consequently, a through hole 110 and an interstitial via hole 111 are formed (see FIG. 27). In this step, the laminated printed circuit board 106 is immersed in a plating solution to be plated with copper. As shown in FIG. 26, however, the hole 104 for the interstitial via hole is covered with the copper foil 102 so that the chamber 108 is sealed. Accordingly, the plating solution can be prevented from invading the chambers 92 and 108.

Figure 28:
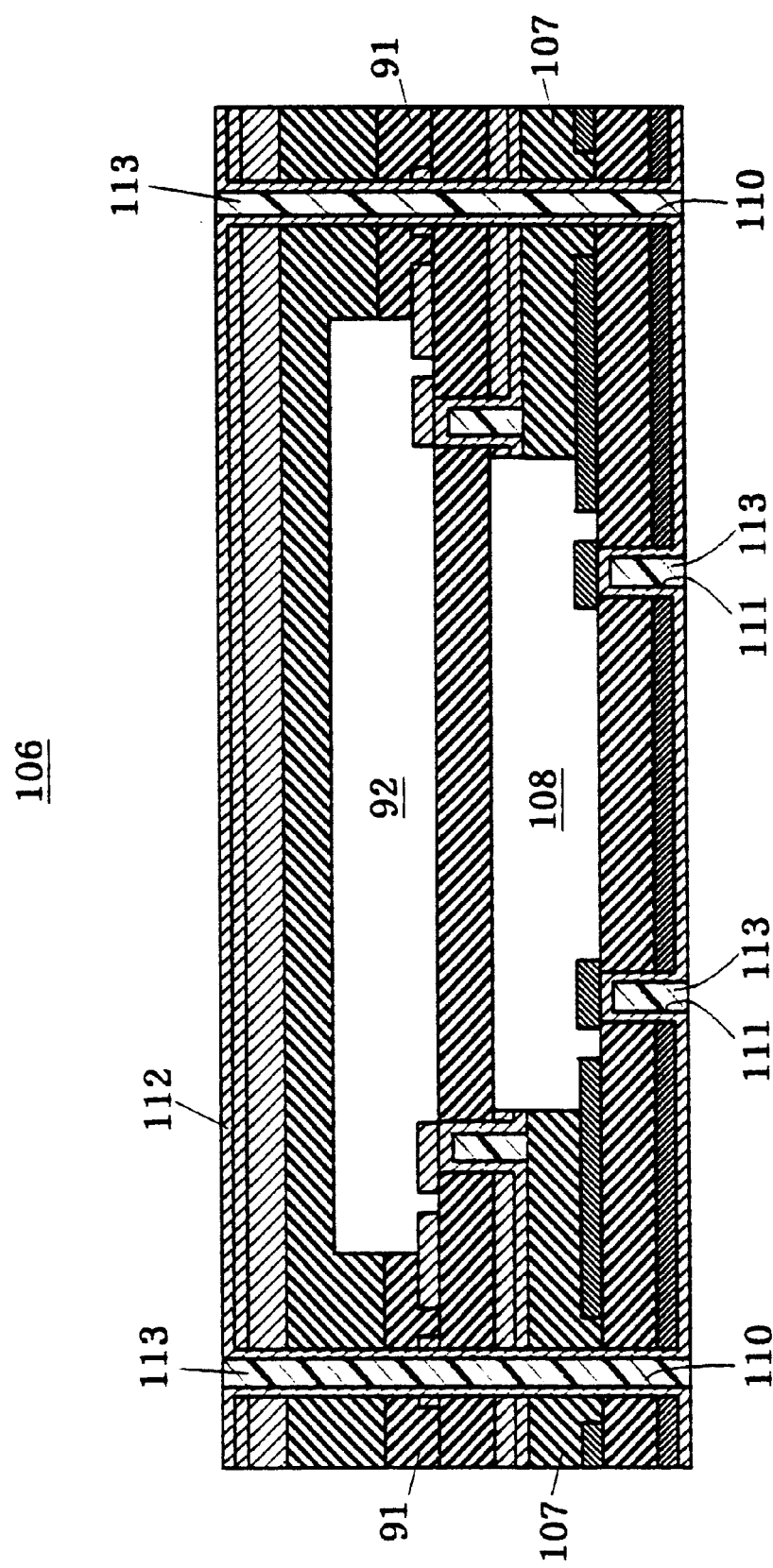
FIG. 28 is a sectional view showing a step in manufacturing the semiconductor device according to the second embodiment of the present invention.
Figure 29:
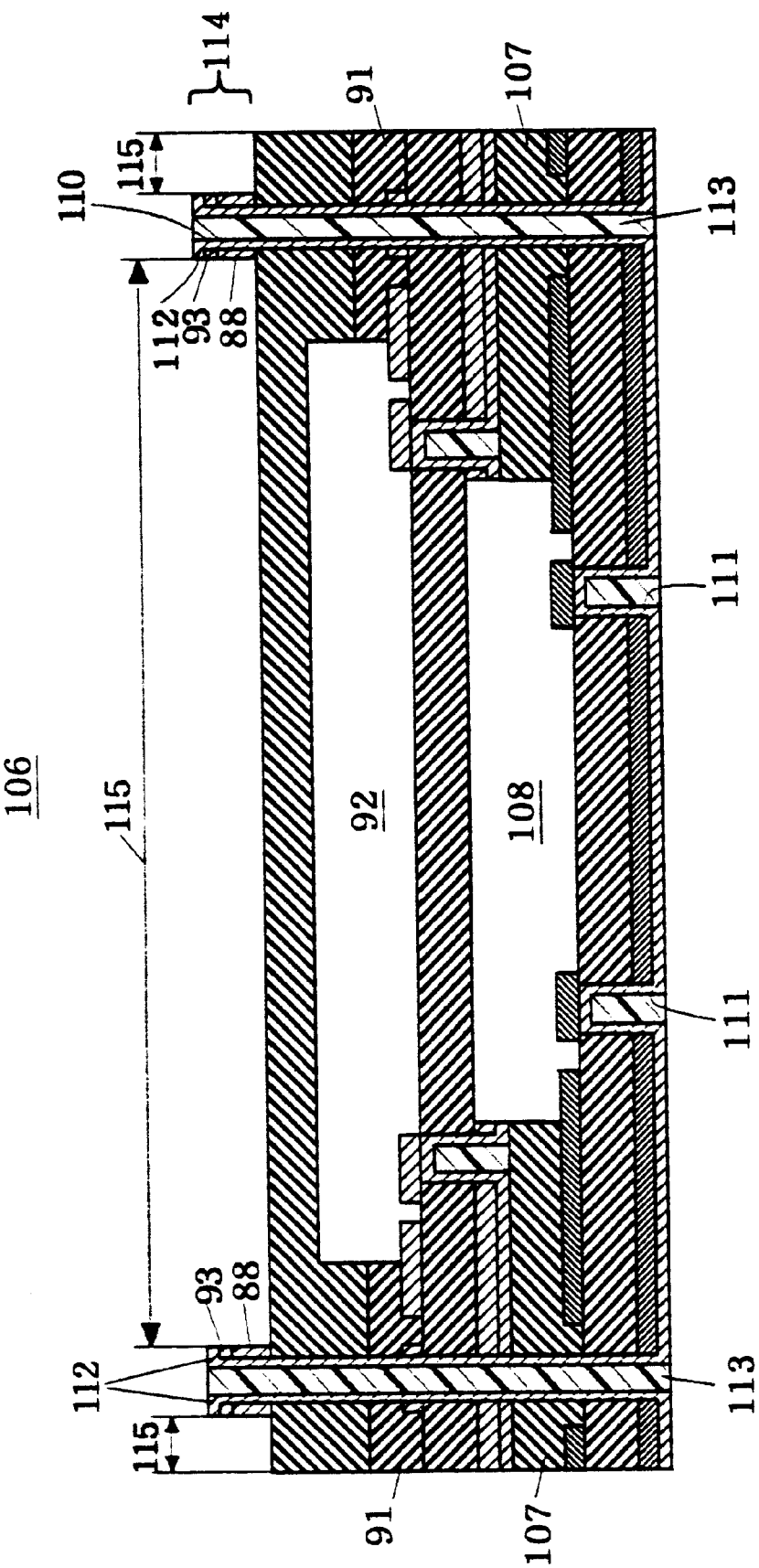
FIG. 29 is a sectional view showing a step in manufacturing the semiconductor device according to the second embodiment of the present invention.
Figure 30:
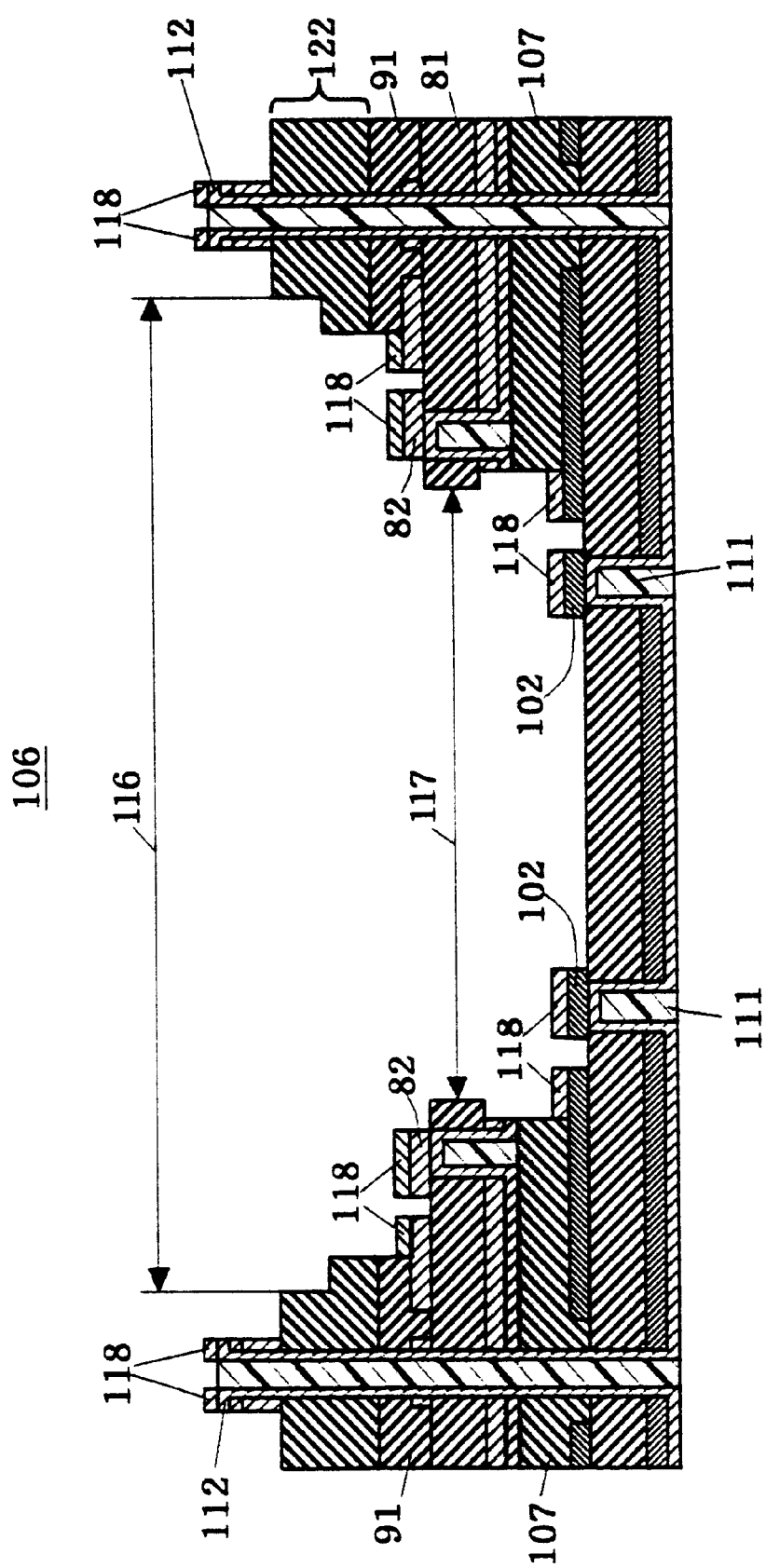
FIG. 30 is a sectional view showing a step in manufacturing the semiconductor device according to the second embodiment of the present invention.

As shown in FIG. 28, the through hole 110 and the interstitial via hole 111 are filled with a resin 113. Then, a wiring layer 114 is patterned (see FIG. 29). In that case, the copper foil 88 and the copper plated layers 93 and 112 in a region 115, except for the through hole 110 and the surroundings thereof, are also removed.

An upper region 116 is milled. A cover supporting portion 122 is opened while a portion to which a cover is to be fixed is being formed. Furthermore, an opening 117 is formed in the insulating substrate 81. After that, a nickel-gold plated layer 118 is formed on the copper foils 82 and 102 and the copper plated layer 112 (see FIG. 30).

Figure 31:
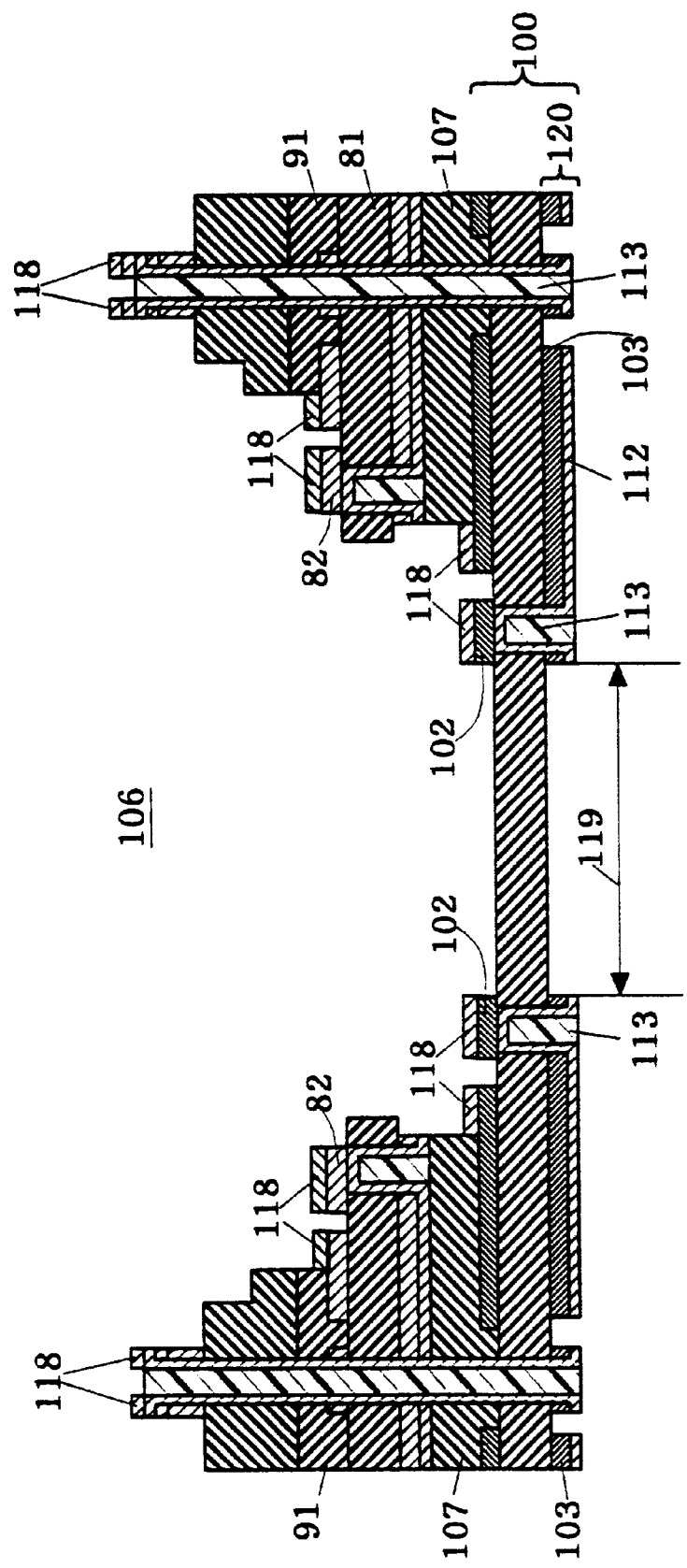
FIG. 31 is a sectional view showing a step in manufacturing the semiconductor device according to the second embodiment of the present invention.

As shown in FIG. 31, a wiring layer 120 is patterned on the other main surface side of the double-sided printed circuit board 100. In that case, the copper foil 103 and the copper plated layer 112 in a lower region 119 where a cavity is located are removed. The patterned wiring layer 120 includes the copper foil 103 and the copper plated layer 112. The thickness of the wiring layer 120 is smaller, by the thickness of the copper plated layer 42, than the wiring layer 23 according to the prior art, which is patterned as shown in FIG. 55. Accordingly, it is easy to make the pattern of the wiring layer 120 finer.

Figure 32:
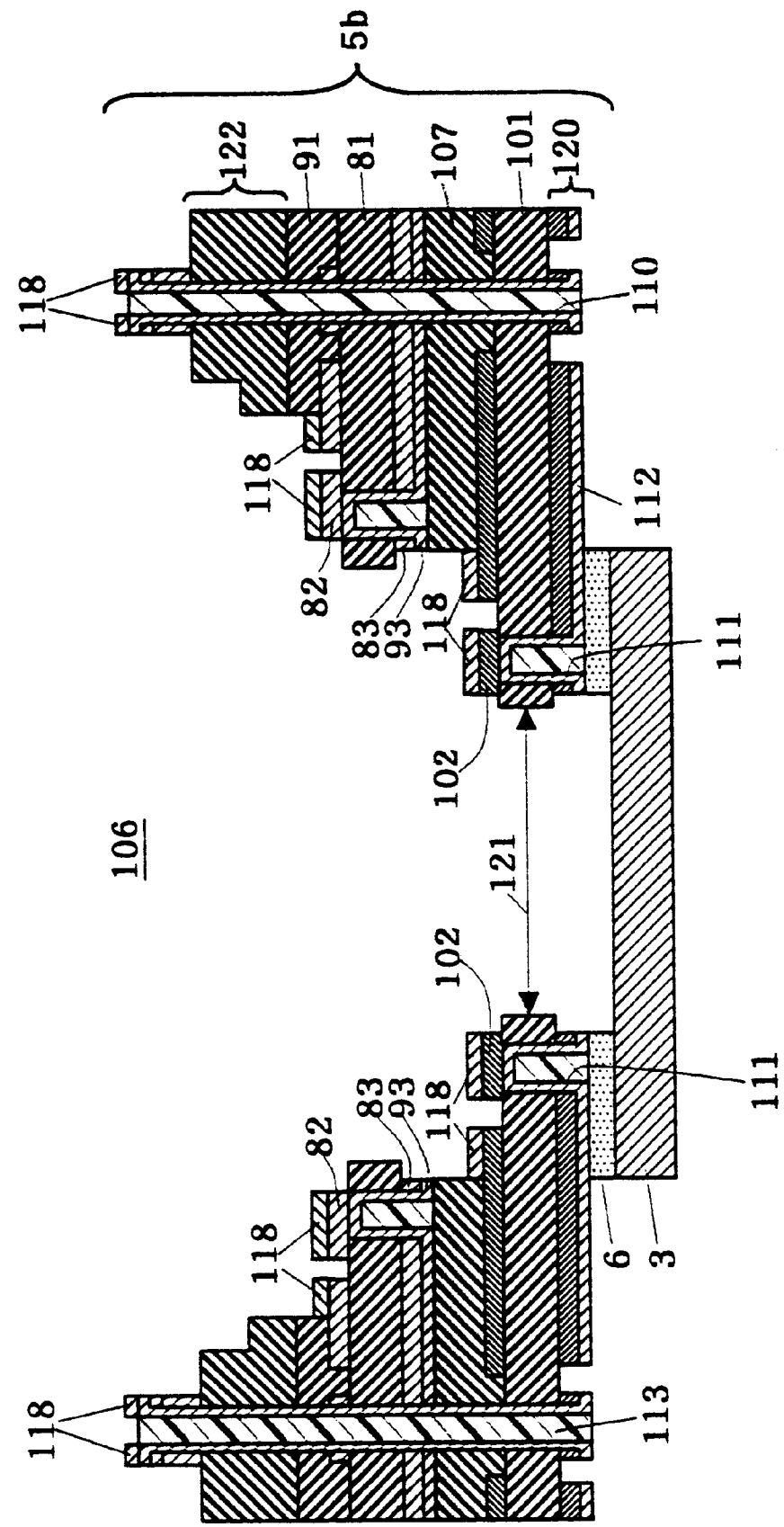
FIG. 32 is a sectional view showing a step in manufacturing the semiconductor device according to the second embodiment of the present invention.

As shown in FIG. 32, an opening 121 is formed in the lower region 119 so that a frame 5b is completed. A slug 3 is bonded to the frame 5b with an adhesive 6.

A chip 2 is bonded to the slug 3 with a die bonding resin 4, and is connected to the nickel-gold plated layer 118 by a wire 8. A cover 130 is mounted with a shielding resin 131 so that a package is sealed. Then, a solder ball 7 is formed on the nickel-gold plated layer 118 of the wiring layer 122. Thus, a semiconductor device 1b having a printed circuit board BGA package is completed.

According to the described process, copper plating forms the interstitial via hole 111 and the through hole 110 at the same time. Consequently, one of plating steps can be omitted, unlike the prior art in which the interstitial via hole and the through hole are formed separately. For this reason, the manufacture of a printed circuit board BGA package is simplified.

An example in which the interstitial via holes 94 and 111 and the through hole 110 are completely filled with the resins 95 and 113 has been described as the second embodiment. The interstitial via hole 94 can be filled with the prepreg 107 when bonding the laminated printed circuit board 90 to the double-sided printed circuit board 100 with the prepreg 107. For this reason, it is not necessary to fill the interstitial via hole 94 with the resin 95. By omitting filling of the interstitial via hole 94 with the resin 95, the process of manufacturing the printed circuit board BGA package can be simplified more.

If it is not necessary to wire bond to a conductor pattern on the interstitial via hole 111 and to apply a solder resist, the step of filling the interstitial via hole 111 with the resin 113 may be omitted. If it is not necessary to apply solder resist to the through hole 110, the step of filling the through hole 110 with the resin 113 may be omitted. When the resin filling step shown in FIG. 28 is omitted, the process of manufacturing the printed circuit board BGA package can be simplified more. The manufacturing cost can be reduced by eliminating all the resin filling steps for the resins 95 and 113.

The copper foils 82 and 102 are never plated with copper before patterning. The copper foils 83 and 103 are plated with copper only once. For this reason, the wiring layers 120 and 123 to 125 on both sides of the insulating substrates 81 and 101 of the frame 5b have smaller thicknesses than the wiring layers in the prior art. Consequently, the wiring layers 120 and 123 to 125 are suitable for the formation of a conductor pattern with a small pitch.

While the case in which two double-sided printed circuit boards 80 and 100 are laminated has been described in the second embodiment, it is possible to laminate more double-sided printed circuit boards by adding the following procedure. More specifically, the same double-sided printed circuit board 80 as the double-sided printed circuit board 80 shown in FIG. 18 is prepared and bonded to the double-sided printed circuit board 80, as shown in FIGS. 20 to 23, before the step of FIG. 25. Then, the same steps are repeated. Thereafter, a further double-sided printed circuit board is prepared and the same steps are repeated. The method for manufacturing a printed circuit board BGA package having such a structure has the same effects as the method for manufacturing a printed circuit board BGA package having the structure obtained by the manufacturing steps according to the second embodiment.

Third Embodiment

A semiconductor device and a method for manufacturing the semiconductor device according to a third embodiment of the present invention is described with reference to FIGS. 34 to 36.

Figure 34:
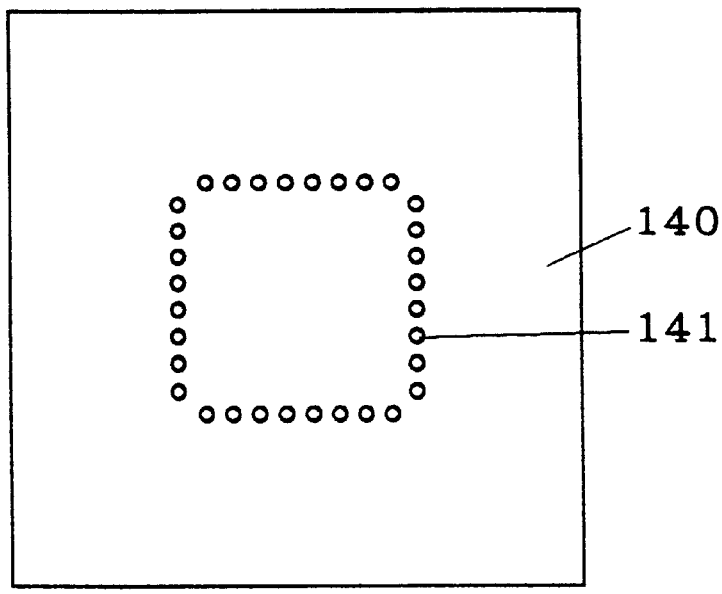
FIG. 34 is a plan view for explaining a semiconductor device according to a third embodiment of the present invention.
Figure 35:
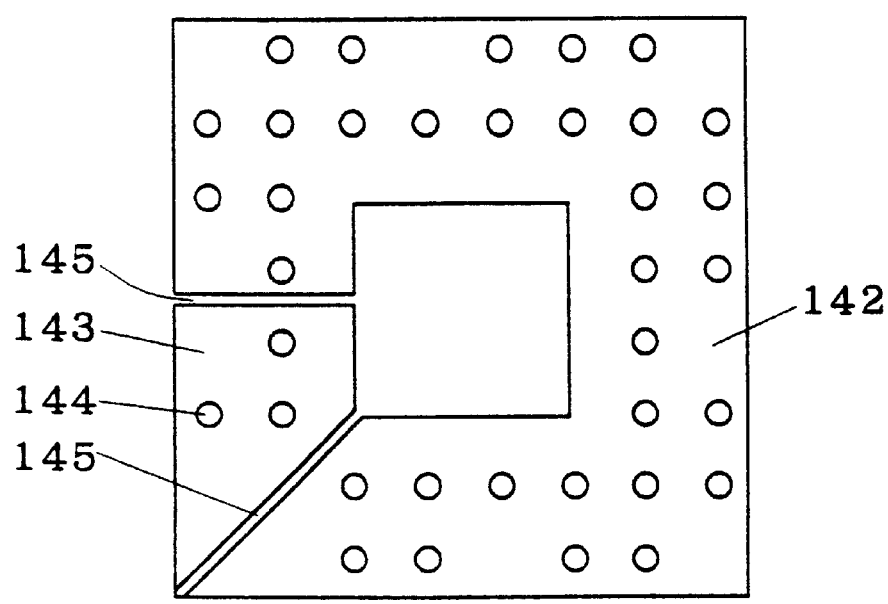
FIG. 35 is a plan view for explaining the semiconductor device according to the third embodiment of the present invention.

FIGS. 34 and 35 are plan views showing the structure of the copper foil obtained at the step shown in FIG. 4 according to the first embodiment. A copper foil 140 shown in FIG. 34 corresponds to the copper foil 30 shown in FIG. 4. Copper foils 142 and 143 shown in FIG. 35 correspond to the copper foil 31a shown in FIG. 4.

FIGS. 34 and 35 are plan views showing the structure of the copper foil obtained at the step shown in FIG. 18 according to the second embodiment. The copper foil 140 shown in FIG. 34 corresponds to the copper foil 82 shown in FIG. 18. The copper foils 142 and 143 shown in FIG. 35 correspond to the copper foil 83 shown in FIG. 18.

The copper foil 140 shown in FIG. 34 comprises a circular hole 141 for an interstitial via hole. A source voltage VDD and a grounding voltage GND are applied to the copper foils 142 and 143 shown in FIG. 35. An aperture 145 is provided between the copper foils 142 and 143 to insulate them from each other. Furthermore, an opening 144 is provided to selectively connect the copper foils 142 and 143 to through holes or the like.

However, when the copper foils 140 and 142 are connected by a plurality of small interstitial via holes, the inductance of the interstitial via holes is increased.

In the semiconductor device according to the first embodiment, the step of forming the hole 60 for the interstitial via hole shown in FIG. 2 is replaced with a step of forming a hole 147 for a slit-shaped interstitial via hole on the periphery of a portion which houses the semiconductor chip 2, as shown in FIG. 36. Consequently, a printed circuit board BGA having the slit-shaped interstitial via hole can be manufactured. Thus, if the interstitial via hole is slit-shaped, the inductance of the interstitial via hole can be decreased.

Where the slit-shaped interstitial via hole is provided on the double-sided printed circuit board 15a or 16a shown in FIG. 4 or 5 in the same manner, and the wiring layer 20a or 23a is a power source plane or ground plane, the inductance of the power source or ground can be reduced further.

In the semiconductor device according to the second embodiment, the step of preparing the double-sided printed circuit board 80 having the hole 84 for the interstitial via hole shown in FIG. 18 is replaced with the step of forming a hole 147 for a slit-shaped interstitial via hole on the periphery of a portion housing the semiconductor chip 2, as shown in FIG. 36. Consequently, a printed circuit board BGA having the slit-shaped interstitial via hole can be manufactured.

Figure 33:
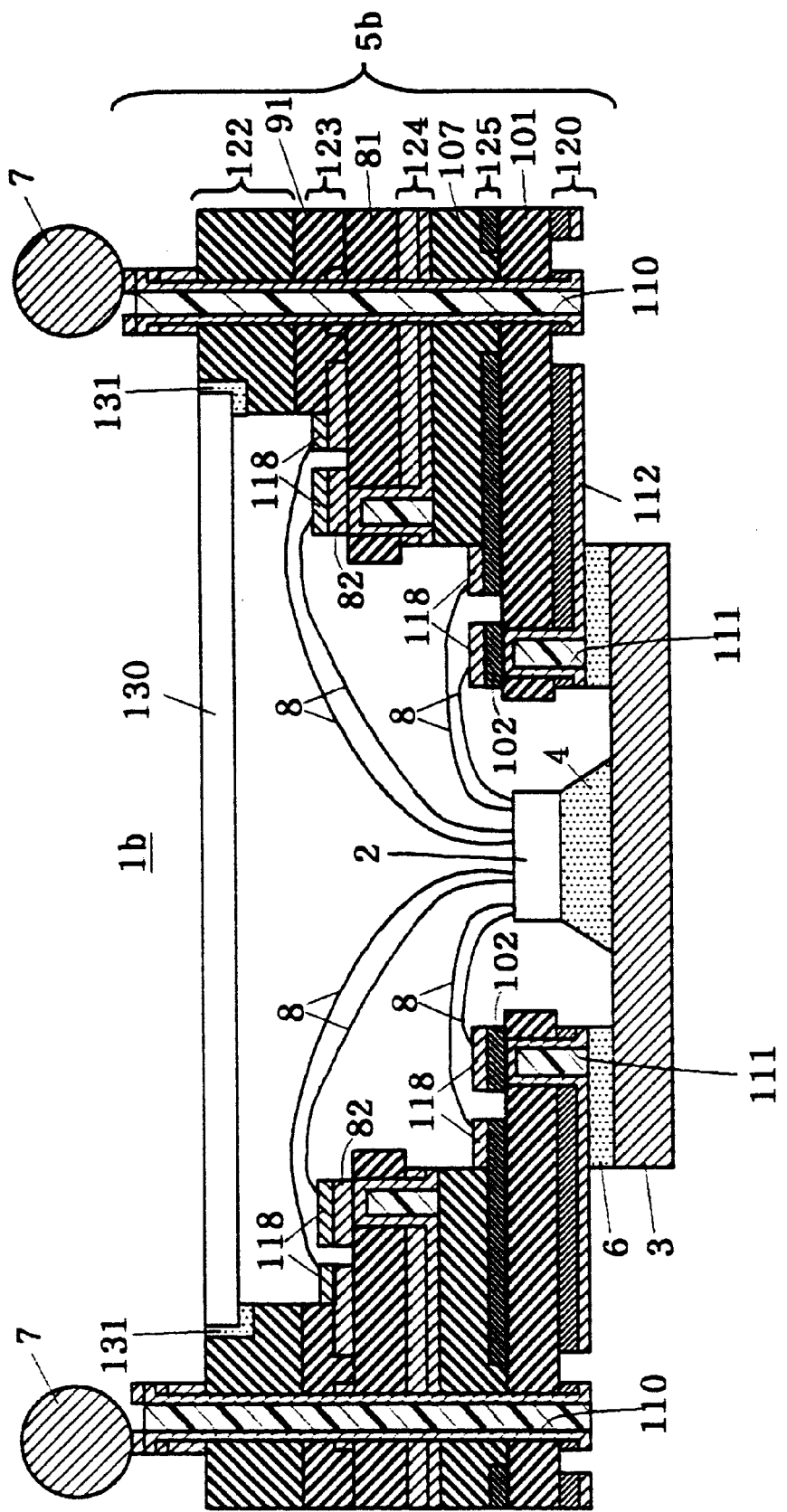
FIG. 33 is a sectional view showing a step in manufacturing the semiconductor device according to the second embodiment of the present invention.

In the case where the interstitial via hole in the insulating substrate 81 or 101 shown in FIG. 33 is slit-shaped and the wiring layer 120 or 124 is a power source plane or ground plane, it is possible to obtain a structure having excellent electrical characteristics in which the inductance of the power source or ground can be further reduced.

Fourth Embodiment

A method for manufacturing a semiconductor device according to a fourth embodiment of the present invention is described with reference to FIGS. 37 to 39. In FIG. 37, the reference numeral 38b designates a laminated printed circuit board, the reference numeral 150 designates a slit-shaped interstitial via hole in an insulating substrate 18, and the same reference numerals designate the same portions as in FIG. 10. The slit-shaped interstitial via hole 150 can be formed as described in the fourth embodiment. The laminated printed circuit board 38b shown in FIG. 37 is prepared. For example, the interstitial via hole 150 shown in FIG. 37 is similar to the slit-shaped interstitial via hole 147 shown in FIG. 36.

Then, an opening 45a is formed in the upper portion of the laminated printed circuit board 38b by milling. Each end of the opening 45a is formed by scraping one of side walls of the interstitial via hole 150. Accordingly, the bottom and the other side wall of the interstitial via hole 150 remain after the opening 45a is formed. Thereafter, the other side wall and the conductor pattern of a wiring layer 19a extending to the other side wall are scraped using an end mill or the like such that the bottom of the interstitial via hole 150 remains.

Figure 38:
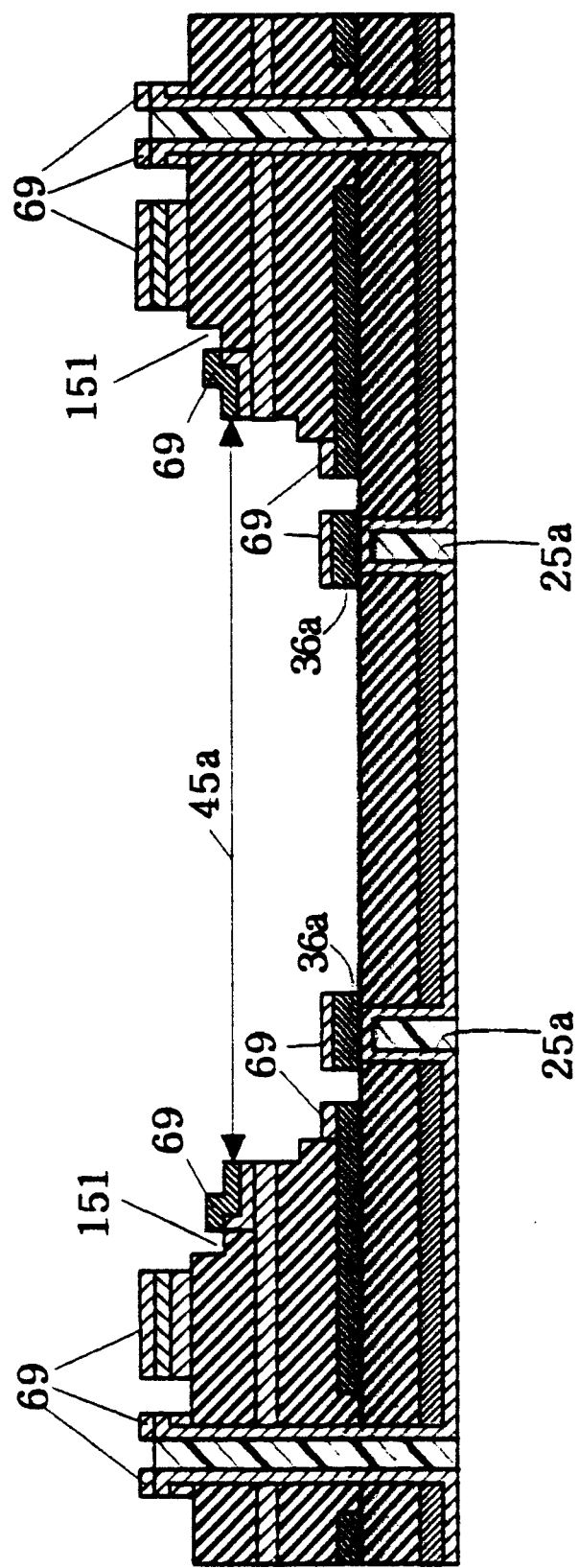
FIG. 38 is a sectional view showing a step in manufacturing the semiconductor device according to the fourth embodiment of the present invention.

A nickel-gold plated layer 69 is also formed on the bottom of the via hole (see FIG. 38). The bottom of the via hole is used as a wire bonding pad of a wiring layer 20a. Because the interstitial via hole 150 has a bottom, the interstitial via hole 150 can be used as the pad due to the machining. FIG. 39 shows a section of the semiconductor device in which a wire 8 is connected using the bottom as the wire bonding pad. Furthermore, the bottom can be used as the wire bonding pad because the interstitial via hole 150 is slit-shaped.

Figure 39:
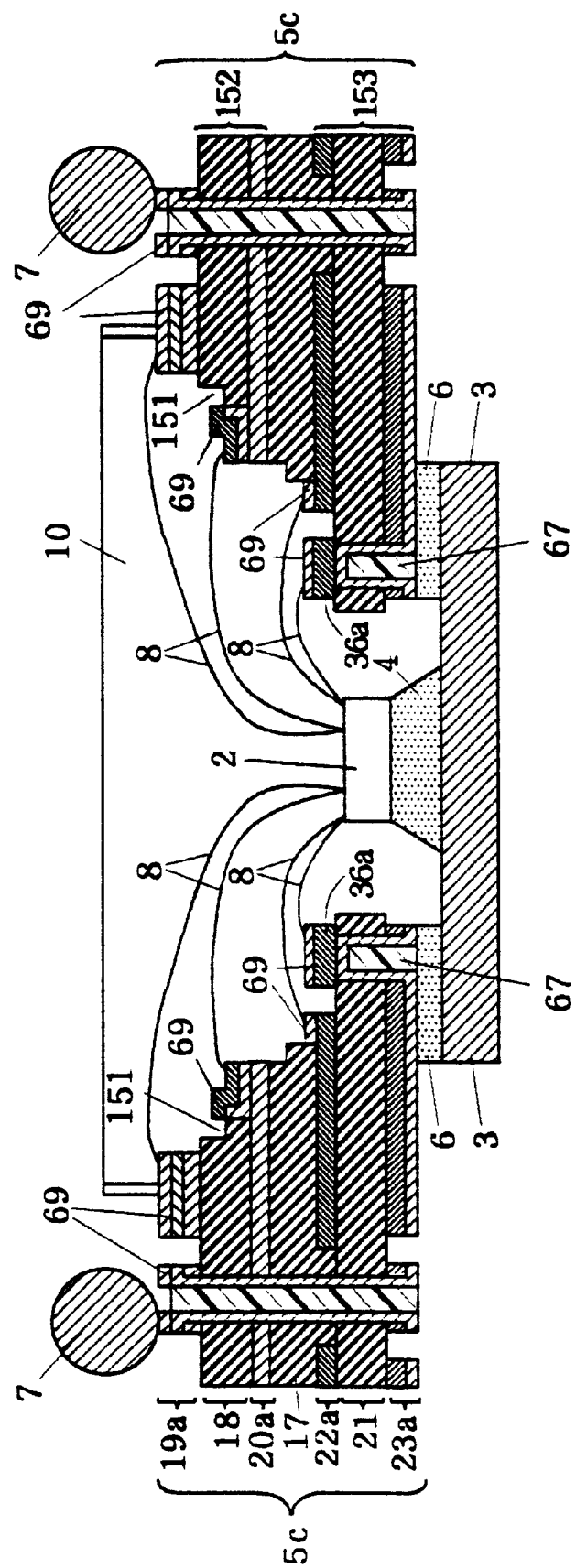
FIG. 39 is a sectional view showing a step in manufacturing the semiconductor device according to the fourth embodiment of the present invention.

As seen from a comparison between the sections of the semiconductor devices shown in FIGS. 39 and 14, the space between the wires 8 connected to the wiring layers 19a and 20a can be increased in the direction of the thickness of the semiconductor device so that short-circuiting of the wires 8 can be prevented.

Fifth Embodiment

Figure 40:
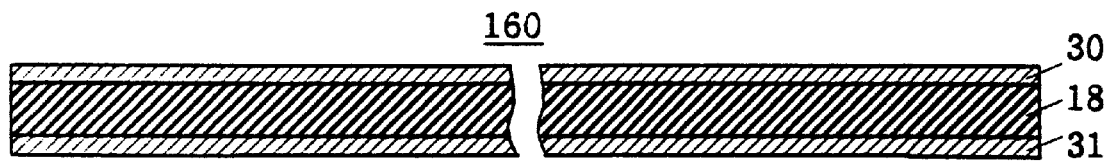
FIG. 40 is a sectional view showing a step in manufacturing a semiconductor device according to a fifth embodiment of the present invention.
Figure 41:
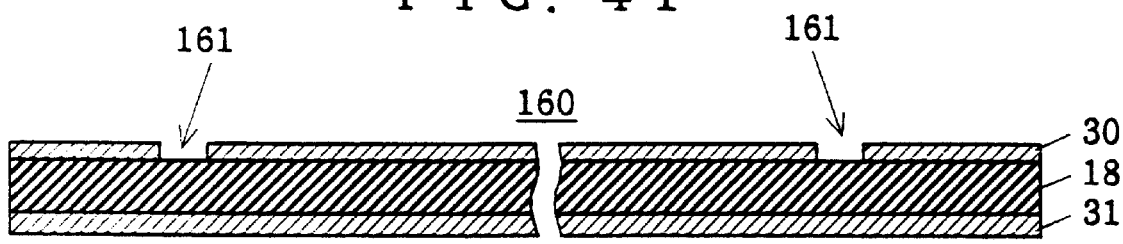
FIG. 41 is a sectional view showing a step in manufacturing the semiconductor device according to the fifth embodiment of the present invention.
Figure 42:
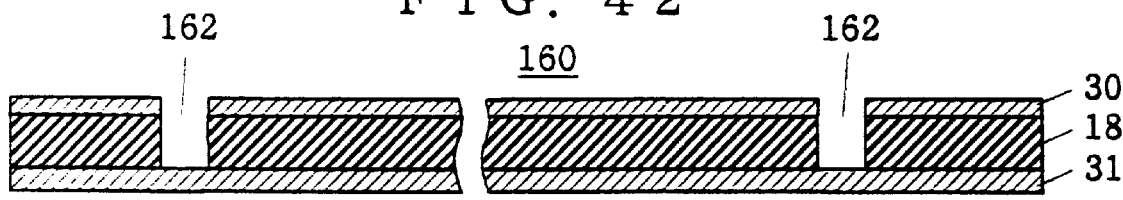
FIG. 42 is a sectional view showing a step in manufacturing the semiconductor device according to the fifth embodiment of the present invention.
Figure 43:
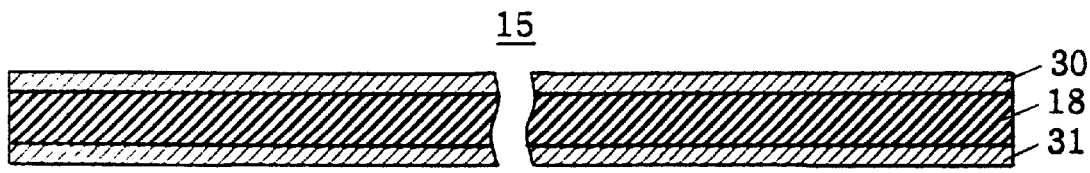
FIG. 43 is a sectional view showing a step in is manufacturing a semiconductor device according to the prior art.
Figure 44:
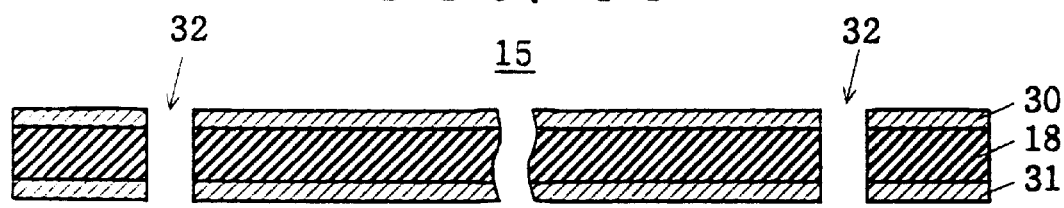
FIG. 44 is a sectional view showing a step in manufacturing the semiconductor device according to the prior art.
Figure 45:
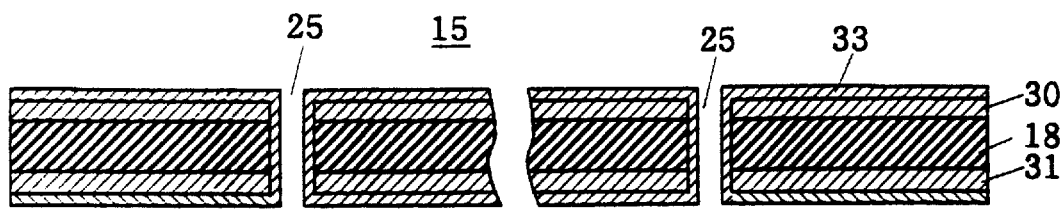
FIG. 45 is a sectional view showing a step in manufacturing the semiconductor device according to the prior art.
Figure 46:
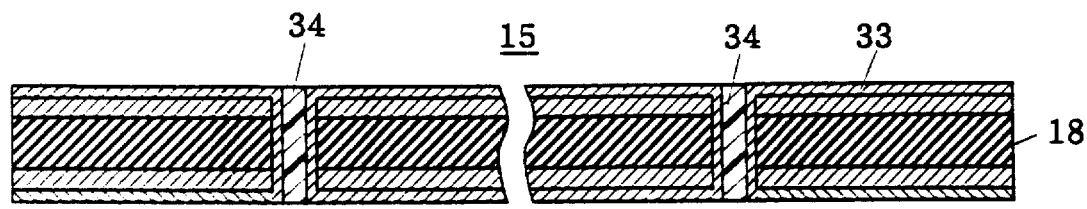
FIG. 46 is a sectional view showing a step in manufacturing the semiconductor device according to the prior art.

A method for manufacturing a semiconductor device according to a fifth embodiment of the present invention will be described below with reference to FIGS. 40 to 42. The steps shown in FIGS. 40 to 42 are substituted for the steps shown in FIGS. 1 to 3 according to the first embodiment. A double-sided printed circuit board 160 is prepared as shown in FIG. 40. Then, a copper foil 30 on one of the sides is patterned. Consequently, the copper foil 30 is removed in a region 161 where a hole for an interstitial via hole is formed (see FIG. 41). As shown in FIG. 42, laser beams irradiate from the copper foil 30 side to form a hole 162 for the interstitial via hole. Thus, the hole 162 for the interstitial via hole is formed so that a copper foil 31 and the copper foil 30 can be laminated at the same time.

While an example in which some of the steps of manufacturing a semiconductor device according to the first embodiment are replaced has been described as the fifth embodiment, the steps according to the fifth embodiment can also be used in the second embodiment so that the same effects can be obtained.

While examples in which a copper foil is used have been described, other metallic foils may be used such that the same effects can be obtained.

While the invention has been described in detail, the foregoing description is in all aspects illustrative and not restrictive. It is understood that numerous other modifications and variations can be devised without departing from the scope of the invention.

We claim:

1. A package for a semiconductor device including:
a plurality of double-sided printed circuit boards, each double-sided printed circuit board having an electrically insulating substrate with opposed first and second main surfaces and first and second metallic foil layers respectively disposed on said first and second main surfaces, said plurality of double-sided printed circuit boards being laminated to form a cavity for receiving a semiconductor chip, at least one of said double-sided printed circuit boards comprising:
a through hole penetrating said electrically insulating substrate from said first main surface to said second main surface and having a side wall extending between the first and second main surfaces, said first metallic foil having an opening conforming to the through hole and said second metallic foil having a region covering the through hole; and
a metallic film disposed in the through hole, contacting and completely covering said side wall of the through hole, and electrically connecting said first metallic foil to said second metallic foil.

2. The package for a semiconductor device as defined in claim 1 wherein the through hole has a slit shape with a length and a width, the length being longer than the width.

3. A package for a semiconductor device including:
a plurality of double-sided printed circuit boards, each double-sided printed circuit board having an electrically insulating substrate with opposed first and second main surfaces and first and second metallic foil layers respectively disposed on said first and second main surfaces, said plurality of double-sided printed circuit boards being laminated to form a cavity for receiving a semiconductor chip, at least one of said double-sided printed circuit boards comprising:
an electrically insulating substrate having first and second main surfaces and an opening forming part of the cavity, a first wiring layer disposed on said first main surface of said electrically insulating substrate, a second wiring layer disposed on said second main surface of said electrically insulating substrate and having a portion projecting beyond said electrically insulating substrate toward the cavity;
a first wire bonding pad comprising a plated metal layer disposed on said first wiring layer; and
a second wire bonding pad comprising a plated metal layer disposed on and continuously extending on the portion of said second wiring layer projecting beyond said electrically insulating substrate and a side wall of said electrically insulating substrate.

4. A package for a semiconductor device including:

a plurality of double-sided printed circuit boards, each double-sided printed circuit board having an electrically insulating substrate with opposed first and second main surfaces and first and second metallic foil layers respectively disposed on said first and second main surfaces, said plurality of double-sided printed circuit boards being laminated to form a cavity for receiving a semiconductor chip, at least one of said double-sided printed circuit boards comprising:

an electrically insulating substrate having first and second main surfaces and a through hole having a slit shape with a length and a width, the length being longer than the width, penetrating from said first main surface to said second main surface;

a first wiring layer disposed on said first main surface of said electrically insulating substrate and having an opening conforming to the through hole;

a second wiring layer disposed on said second main surface of said electrically insulating substrate and covering the through hole, the second wiring layer being divided into mutually electrically isolated first and second portions, the first portion providing a power source plane and the second portion providing a ground plane; and a metallic film disposed on said electrically insulating substrate in the through hole, electrically connecting said first wiring layer to one of said first and second portions of said second wiring layer.

5. The package for a semiconductor device as claimed in claim 1 including a resin disposed in and filling the through hole, inside and in contact with said metallic film.

* * * * *